(12) United States Patent
Maeda

(10) Patent No.: US 9,589,648 B1
(45) Date of Patent: Mar. 7, 2017

(54) SEMICONDUCTOR MEMORY DEVICE

(71) Applicant: KABUSHIKI KAISHA TOSHIBA, Tokyo (JP)

(72) Inventor: Takashi Maeda, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/061,967

(22) Filed: Mar. 4, 2016

(30) Foreign Application Priority Data

Aug. 27, 2015 (JP) .................................. 2015-167323

(51) Int. Cl.
G11C 16/04 (2006.01)
G11C 16/10 (2006.01)
G11C 16/34 (2006.01)

(52) U.S. Cl.
CPC .......... *G11C 16/10* (2013.01); *G11C 16/0483* (2013.01); *G11C 16/3468* (2013.01)

(58) Field of Classification Search
CPC . G11C 16/3404; G11C 16/30; G11C 16/0483; G11C 16/26; G11C 2213/71
USPC .................................................. 365/185.25
See application file for complete search history.

(56) References Cited

U.S. PATENT DOCUMENTS

| 8,451,672 | B2 | 5/2013 | Tachibana |
| 8,917,552 | B2 | 12/2014 | Maeda |
| 9,330,771 | B2 * | 5/2016 | Shim ...................... G11C 16/14 |
| 2005/0057965 | A1 | 3/2005 | Cernea et al. |
| 2012/0287710 | A1 | 11/2012 | Shirakawa |
| 2013/0336056 | A1 | 12/2013 | Maeda |
| 2014/0063972 | A1 | 3/2014 | Maeda |
| 2016/0055911 | A1 * | 2/2016 | Nguyen ................. G11C 16/10 365/185.17 |
| 2016/0099063 | A1 * | 4/2016 | Shim ...................... G11C 16/14 365/185.19 |

* cited by examiner

Primary Examiner — Han Yang
Assistant Examiner — Xiaochun L Chen
(74) Attorney, Agent, or Firm — Patterson & Sheridan, LLP

(57) ABSTRACT

A semiconductor memory device includes a memory string on a well, the memory string including a memory cell connected in series between first and second select transistors, a bit line and a source line respectively connected to the first and second select transistors, a well line connected to the well, first and second select lines respectively connected to gates of the first and second select transistors, a word line connected to a gate of the memory cell transistor, and a control circuit that performs a write operation on the first select transistor, the write operation including a pre-charge operation of the bit line, in which a first voltage is applied to the word line and the second select line, a second voltage higher than the first voltage to the source line and the well line, and a third voltage higher than the first voltage to the first select line.

20 Claims, 21 Drawing Sheets

Electron conduction (a) $Vg-Vbl \geqq Vthn$ (b) $Vg-Vbl < Vthn$

Hole conduction (a) $Vg-Vcw > Vthp$ (b) $Vg-Vcw \leqq Vthp$

FIG. 7A
Electron & Hole conduction
FIG. 7B
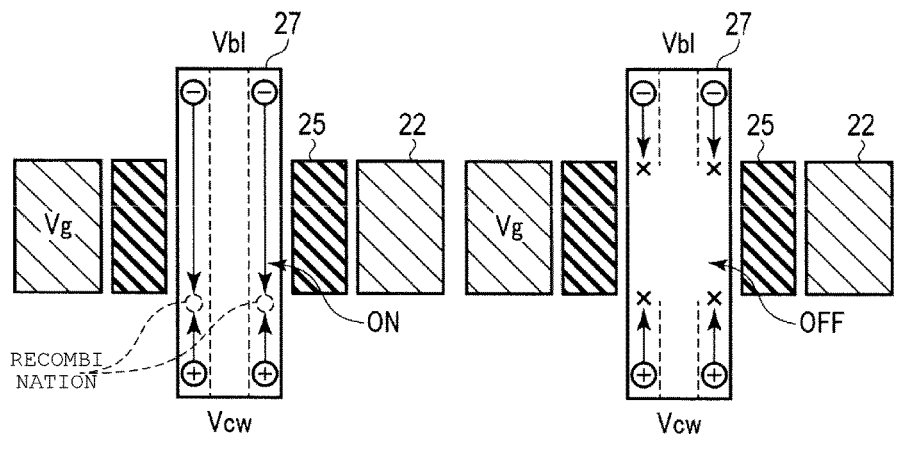
(a) $Vg-Vbl \geq Vthn$, $Vg-Vcw > Vthp$
(b) $Vg-Vbl < Vthn$, $Vg-Vcw > Vthp$
FIG. 8
|  | $Vthn \leq Vg$ | $Vg < Vthn < Vg + \Delta np - Vcw$ | $Vg + \Delta np - Vcw \leq Vthn$ |
|---|---|---|---|
| Electron | ON | OFF | OFF |
| Hole | OFF | OFF | ON |
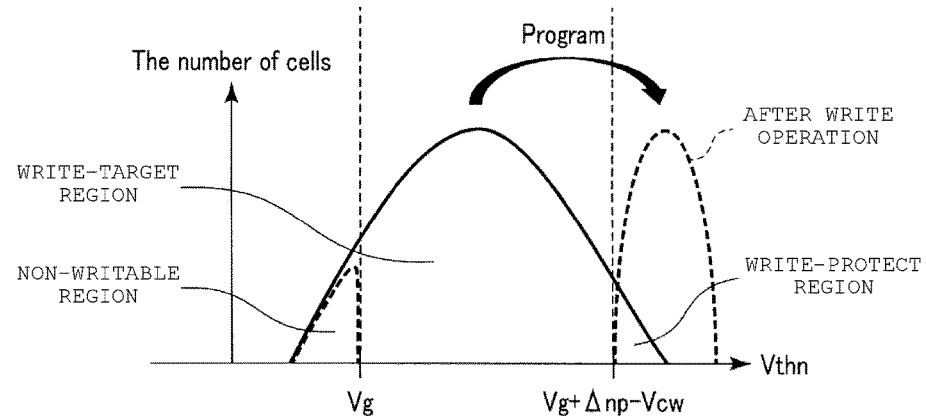

SEMICONDUCTOR MEMORY DEVICE

CROSS-REFERENCE TO RELATED APPLICATION

This application is based upon and claims the benefit of priority from Japanese Patent Application No. 2015-167323, filed Aug. 27, 2015, the entire contents of which are incorporated herein by reference.

FIELD

Embodiments described herein relate generally to a semiconductor memory device.

BACKGROUND

Generally, a NAND flash memory in which memory cells are arranged in three dimensions is known.

DESCRIPTION OF THE DRAWINGS

FIGS. 7A and 7B are schematic diagrams each illustrating an operation of the select transistor of the semiconductor memory device according to the first embodiment.

FIG. 8 is a diagram illustrating changes in a threshold voltage distribution of the select transistor when the semiconductor memory device operates according to the first embodiment.

DETAILED DESCRIPTION

Embodiments described herein provide a semiconductor memory device capable of improving the reliability of data.

In general, according to one embodiment, a semiconductor memory device includes a memory string that is formed on a well, the memory string including a first select transistor, a memory cell transistor, and a second select transistor connected in series, a bit line connected to one end of the first select transistor, a source line connected to one end of the second select transistor, a well line connected to the well, a first select line connected to a gate of the first select transistor, a word line connected to a gate of the memory cell transistor, a second select line connected to a gate of the second select transistor, and a control circuit configured to perform a write operation on the first select transistor. In the write operation, a pre-charge operation of the bit line is performed before a program voltage is applied to the first select line. In the pre-charge operation, a first voltage is applied to the word line and the second select line, a second voltage higher than the first voltage is applied to the source line and the well line, and a third voltage lower than the second voltage is applied to the first select line.

Hereinafter, embodiments will be described with reference to the accompanying drawings. In the following description, the same reference numbers will be assigned to elements with the same functions and configurations.

[1] First Embodiment

In a semiconductor memory device 1 according to a first embodiment, a write-protect bit line BL is charged with carriers supplied from a well line CPWELL, and data is written to a select transistor ST1 in a full page writing operation.

[1-1] Configuration

[1-1-1] Entire Configuration

Figure 1:
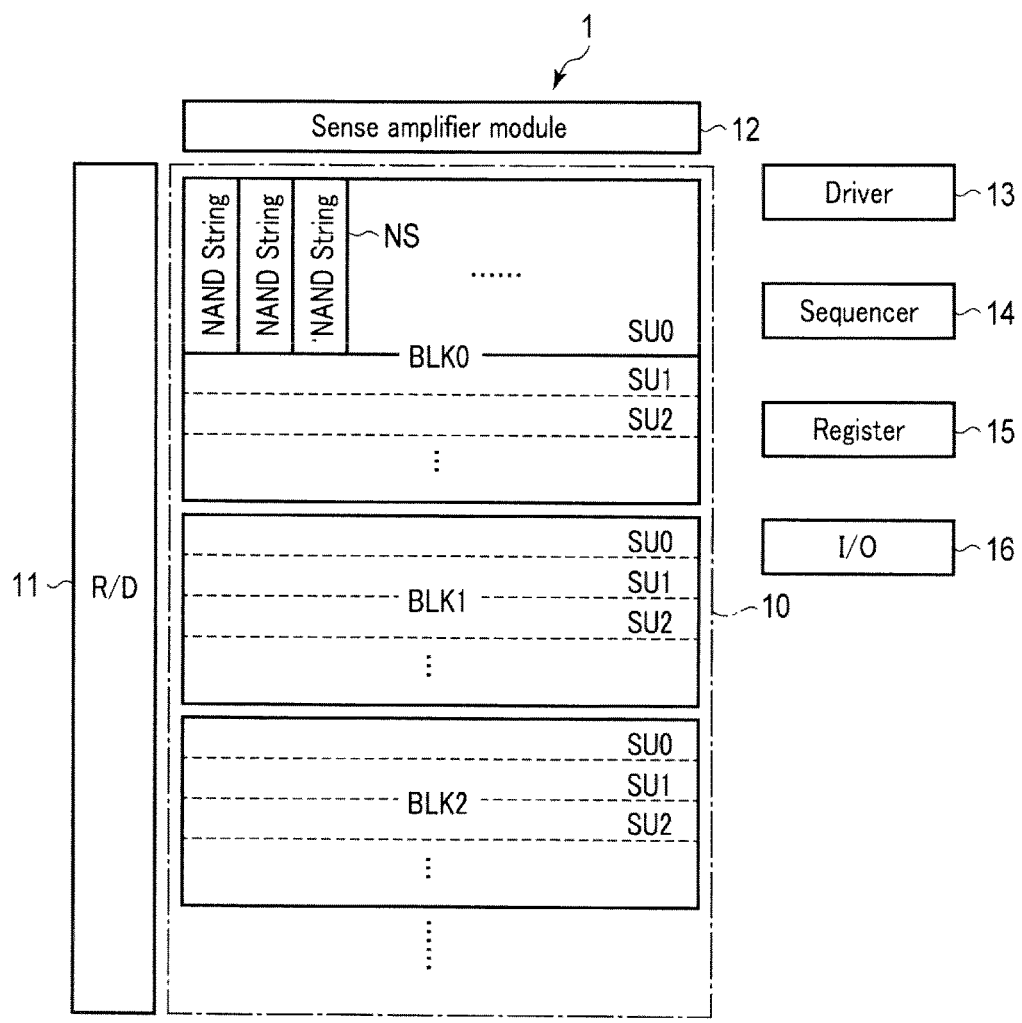
FIG. 1 is a block diagram of a semiconductor memory device according to a first embodiment.

The entire configuration of the semiconductor memory device 1 will be described with reference to FIG. 1. The semiconductor memory device 1 includes a memory cell array 10; a row decoder (R/D) 11; a sense amplifier module 12; a driver 13; a sequencer (controller) 14; a register 15; and an input and output circuit (I/O) 16.

The memory cell array 10 includes multiple blocks BLK (BLK0, BLK1, BLK2, . . . ), each of which includes a group of multiple non-volatile memory cells which are associated with word lines and bit lines. The block BLK is, for example, a unit of data erasing, and items of data in the same block BLK are collectively erased. The erase operation is not limited to the aforementioned operation. Other erase operations are disclosed in U.S. patent application Ser. No. 13/235,389 entitled "non-volatile semiconductor memory device," filed on Sep. 18, 2011, and U.S. patent application Ser. No. 12/694,690 entitled "non-volatile semiconductor memory device," filed on Jan. 27, 2010. The entire contents of these patent applications are incorporated in this disclosure by reference.

Each of the blocks BLK includes multiple string units SU (SU0, SU1, SU2, . . . ), each of which includes a group of NAND strings NS in which memory cells are connected in series. It is possible to arbitrarily set the number of blocks in the memory cell array 10 and the number of string units SU in one block BLK.

The row decoder 11 decodes a block address or a page address, selects any of the word line WL of the corresponding block BLK, and properly applies voltages to the selected word line and non-selected word lines.

In data reading, the sense amplifier module 12 senses a voltage on the bit line BL connected to a memory cell being read according to data stored in the memory cell. In data writing, the sense amplifier module 12 applies a voltage to the bit line BL connected to a memory cell being written according to the write data.

The driver 13 generates a voltage required to write, read, and erase data, and supplies the voltage to the row decoder 11 and the sense amplifier module 12. The voltage is applied to various wirings in the memory cell array 10.

The sequencer 14 controls the operation of the semiconductor memory device 1.

The register 15 stores various signals. For example, the register 15 stores a status of a data write or erase operation, and this status notifies an external controller (not illustrated) whether the operation has normally completed. The register 15 is capable of storing a command, an address, and the like received from the external controller, and storing various tables.

The input and output circuit 16 exchanges data with the external controller or host equipment (not illustrated). In data reading, the input and output circuit 16 outputs the read data sensed by the sense amplifier module 12 to the outside. In data writing, the input and output circuit 16 transfers write data received from the outside to the sense amplifier module 12.

[1-1-2] Memory Cell Array 10

Figure 2:
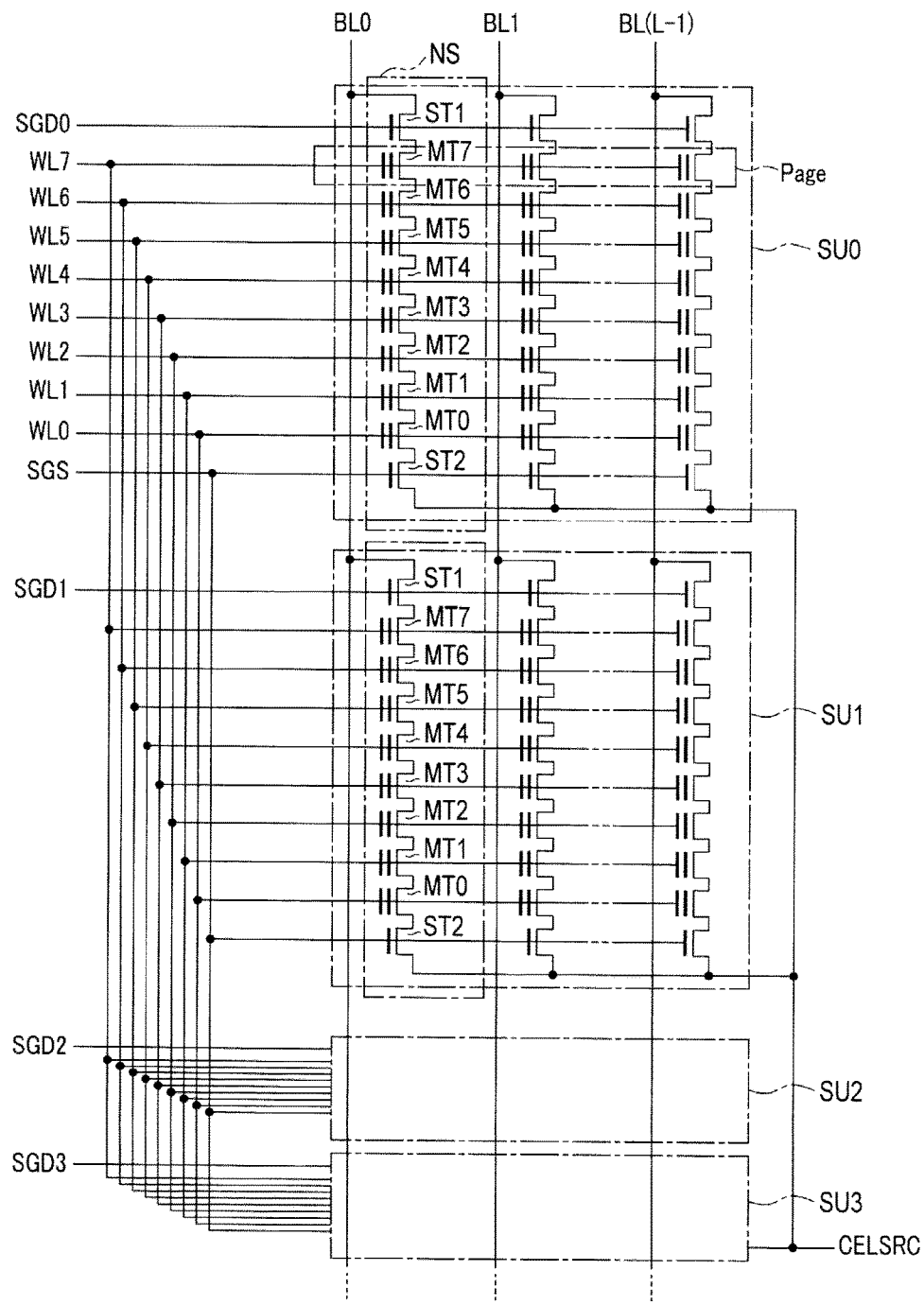
FIG. 2 is a circuit diagram of a memory cell array of the semiconductor memory device according to the first embodiment.

The circuit configuration of the memory cell array 10 of the semiconductor memory device 1 will be described with reference to FIG. 2.

First, the configuration of the block BLK of the memory cell array 10 will be described. FIG. 2 illustrates one of the blocks BLK of the memory cell array 10, and other blocks BLK also have the same configuration.

For example, the block BLK includes four string units SU (SU0 to SU3). Each of the string units SU includes multiple NAND strings NS. For example, each of the NAND strings NS includes, for example, eight memory cell transistors MT (MT0 to MT7) and select transistors ST1 and ST2. Each of the memory cell transistors MT and the select transistors ST1 and ST2 includes a control gate and a layered gate including a charge storage layer. The memory cell transistors MT and the select transistor ST1 are capable of changing its threshold voltage.

The memory cell transistor MT stores data in a non-volatile manner. The memory cell transistors MT0 to MT7 are connected in series between the select transistor ST1 and the select transistor ST2. The select transistors ST1 and ST2 are used to select a NAND string from which data is written to, read and erased. A first end of the select transistor ST1 is connected to a first end of the memory cell transistor MT7. A first end of the select transistor ST2 is connected to a first end of the memory cell transistor MT0.

Hereinafter, the configuration of wirings connected to the memory cell array 10 will be described. The semiconductor memory device 1 includes the bit line BL; the word line WL; select gate lines SGD and SGS; and a source line CELSRC.

The bit line BL is connected to the sense amplifier module 12 (not illustrated), and for example, L (L is a natural number greater than or equal to one) bit lines BL are provided. The bit line BL is connected to a second end of the select transistor ST1 of the corresponding NAND string NS. The bit line BL is connected to the NAND strings NS which are aligned along the same line across multiple blocks BLK.

The word line WL is connected to the row decoder 11 (not illustrated), and for example, eight word lines WL (word lines WL0 to WL7) are provided for each of the blocks BLK. The word lines WL0 to WL7 are respectively connected to the gate of the memory cell transistors MT0 to MT7 in each of the string units.

The select gate line SGD is connected to the row decoder 11 (not illustrated), and for example, four select gate lines SGD (select gate lines SGD0 to SGD3) are provided for each of the blocks BLK. The number of select gate lines SGD corresponds to the number of string units SU. The select gate line SGD is connected to the gate of the select transistor ST1 in the corresponding string unit SU.

The select gate line SGS is connected to the row decoder 11 (not illustrated), and for example, one select gate line SGS is provided for each of the blocks. The select gate line SGS is connected to the gate of the select transistor ST2 in each of the string units SU.

The source line CELSRC is connected to the driver 13 (not illustrated), and for example, is common to the multiple blocks. The source line CELSRC is connected to a second end of the select transistor ST2 in each of the string units SU.

Items of data are collectively read from and written to multiple memory cell transistors MT which are connected to a common word line WL in any of the string units SU of any of the blocks BLK. A page is defined as a unit used in data reading and writing. Data can be also read from and written to the select transistor ST1.

The number of string units SU can be set as an arbitrary number. The number of memory cell transistors MT included in the NAND string NS may be, for example, 16, 32, 64, or 128, but is not limited to those numbers.

The sectional structure of the memory cell array 10 of the semiconductor memory device 1 will be described with reference to FIG. 3.

The multiple NAND strings NS are formed on a p-type well area 20 of the semiconductor memory device 1. Specifically, multiple wiring layers 21 serving as the select gate lines SGS, multiple wiring layers 22 serving as the word lines WL, and multiple wiring layers 23 serving as the select gate lines SGD are formed on the p-type well area 20.

Four wiring layers 21 are formed, for example. The wiring layer 21 is electrically connected to the select gate line SGS common to the multiple NAND strings NS, and serves as a gate electrode of select transistor ST2.

Eight wiring layers 22 are formed, and each of the wiring layers 22 is electrically connected to a word line WL.

Four wiring layers 23 are formed, for example. The wiring layer 23 is connected to the select gate line SGD corresponding to each of the NAND strings NS, and serves as a gate electrode of select transistor ST1.

A memory hole MH is formed so as to pass through the wiring layers 21, 22, and 23, and as to reach the p-type well area 20. A block insulating film 24, a charge storage layer (insulating film) 25, and a tunnel oxide film 26 are sequentially formed on a side surface of the memory hole MH. A conducting film (semiconductor pillar) 27 is embedded into the memory hole MH. The semiconductor pillar 27 is made of undoped polysilicon or the like, and serves as a current path of the NAND string NS. A wiring layer 28 is formed at an upper end of the semiconductor pillar 27, and serves as the bit line BL.

As described above, the select transistor ST2, the multiple memory cell transistors MT, and the select transistor ST1 are sequentially stacked on the p-type well area 20. One memory hole MH corresponds to one NAND string NS.

A $n^+$ type impurity diffusion layer 29 and $p^+$ type impurity diffusion layer 30 are formed on the surface of the p-type well area 20.

A contact plug 31 is formed on the $n^+$ type impurity diffusion layer 29, and a wiring layer 32 serving as the source line CELSRC is formed on the contact plug 31. The source line SL is electrically connected to the driver 13.

A contact plug 33 is formed on the $p^+$ type impurity diffusion layer 30, and a wiring layer 34 serving as the well line CPWELL is formed on the contact plug 33. The well line CPWELL is electrically connected to the driver 13.

The contact plugs 31 and 33 are formed to have flat surfaces in a depth direction.

The wiring layers 32 and 34 are formed above the wiring layers 23 (the select gate line SGD).

Figure 3:
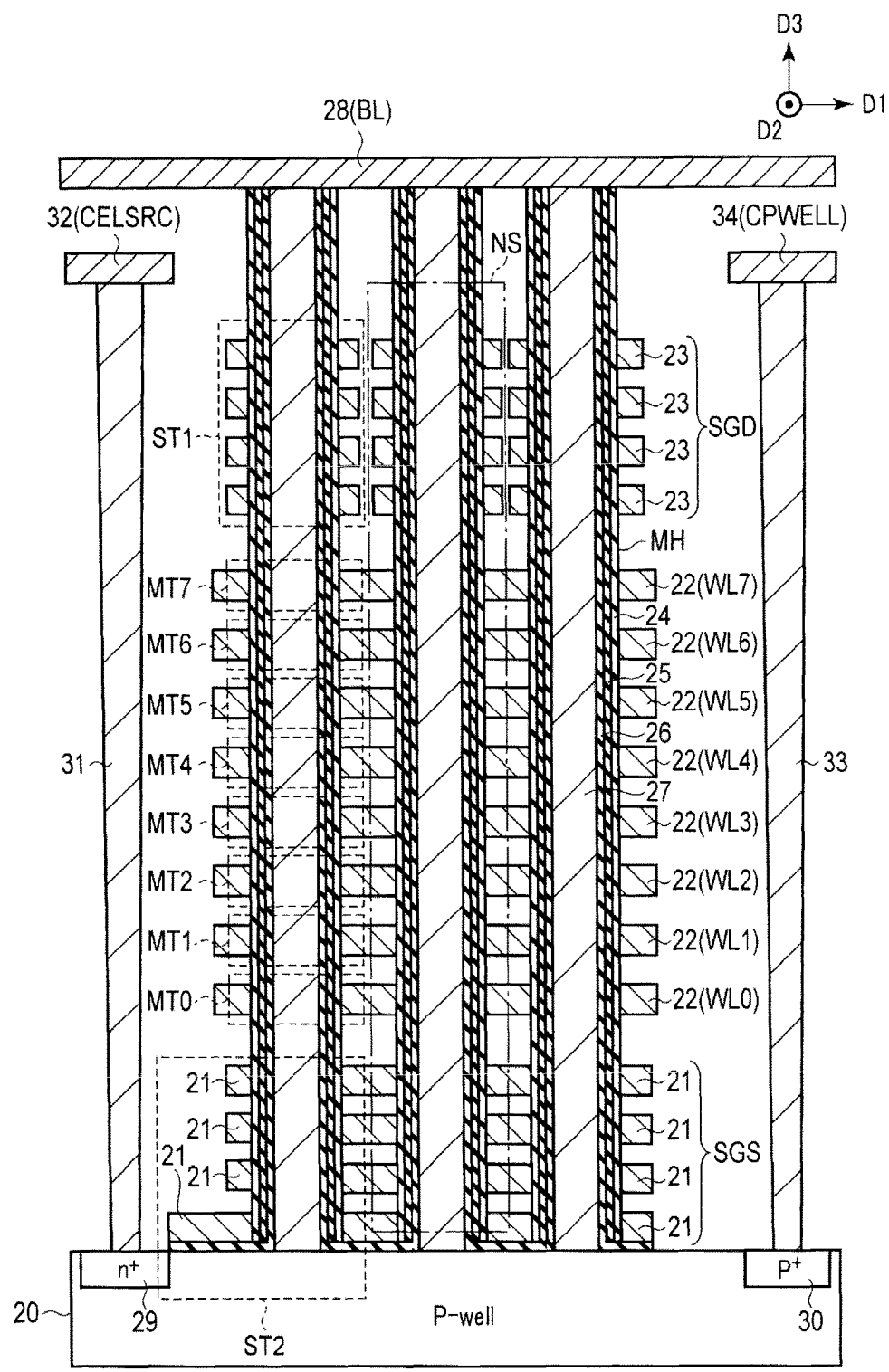
FIG. 3 is a cross sectional view of the memory cell array of the semiconductor memory device according to the first embodiment.

The multiple NAND strings NS with the aforementioned configuration are arrayed in the depth direction of the sheet on which FIG. 3 is illustrated. One string unit SU is formed of the multiple NAND strings NS lining up per row in the depth direction.

The wiring layers 21 serve as the common select gate line SGS, and are electrically connected together in the same block BLK. The tunnel oxide film 26 is formed between the lowermost one of the wiring layers 21 and the p-type well area 20. The lowermost wiring layer 21 adjacent to the $n^+$ type impurity diffusion layer 29, and the tunnel oxide film 26 are formed in the vicinity of the $n^+$ type impurity diffusion layer 29.

Accordingly, when the select transistor ST2 is turned on, a formed channel electrically connects the memory cell transistor MT0 and the $n^+$ type impurity diffusion layer 29. The driver 13 is capable of applying a potential to the semiconductor pillar 27 by applying a voltage to the well line CPWELL.

The configuration of the memory cell array 10 may be different from the aforementioned configuration. For example, another configuration of the memory cell array is disclosed in U.S. patent application Ser. No. 12/407,403 entitled "three-dimensionally stacked non-volatile semiconductor memory," filed on Mar. 19, 2009. In addition, other configurations of the memory cell array are disclosed in U.S. patent application Ser. No. 12/406,524 entitled "three-dimensionally stacked non-volatile semiconductor memory," filed on Mar. 18, 2009, in U.S. patent application Ser. No. 12/679,991 entitled "non-volatile semiconductor memory device and manufacturing method thereof," filed on Mar. 25, 2010, and in U.S. patent application Ser. No. 12/532,030 entitled "semiconductor memory and manufacturing method thereof," filed on Mar. 23, 2009. The entire contents of these patent applications are incorporated in this disclosure by reference.

[1-1-3] Sense Amplifier Module 12

Figure 4:
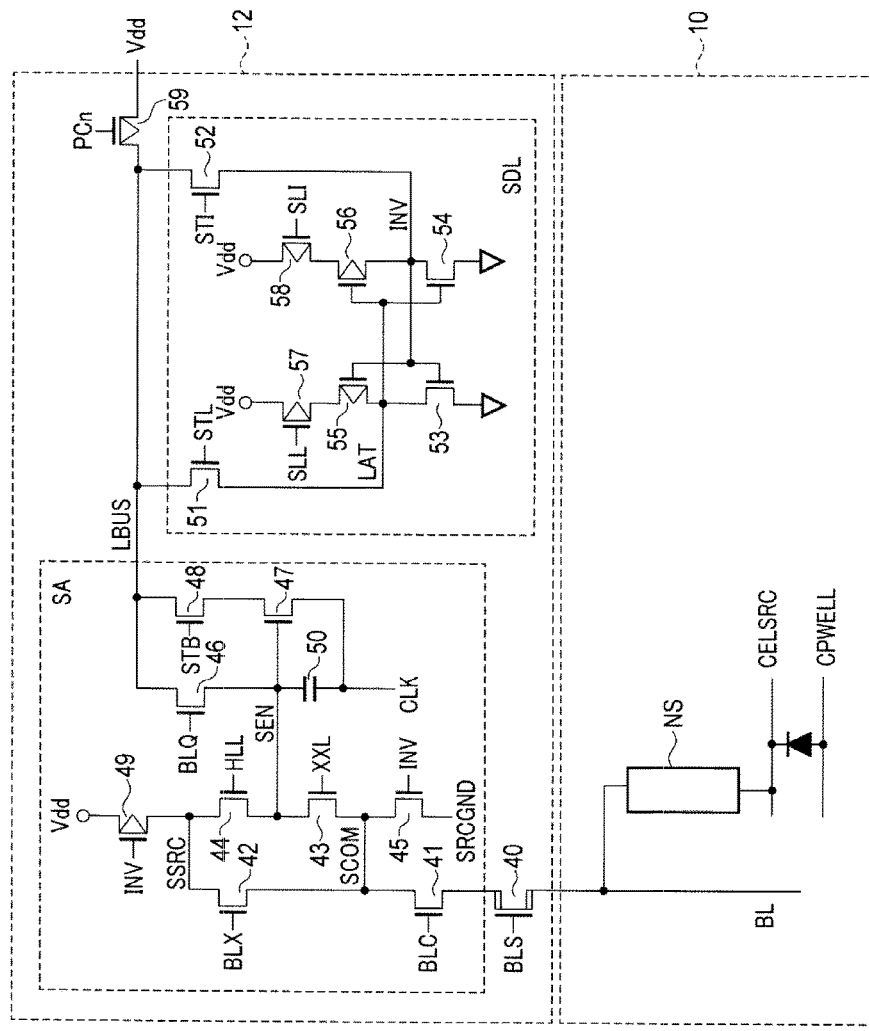
FIG. 4 is a circuit diagram of a sense amplifier module of the semiconductor memory device according to the first embodiment.

The circuit configuration of the sense amplifier module 12 of the semiconductor memory device 1 will be described with reference to FIG. 4.

The sense amplifier module 12 includes a sense amplifier unit SA and a latch circuit SDL. The sense amplifier unit SA applies a voltage to the bit line BL according to data stored by the latch circuit SDL. The latch circuit SDL stores write data received from the input and output circuit 16. When each of the memory cell transistors MT stores two or more bits of data, two or more latch circuits are provided.

The sense amplifier unit SA includes a high-voltage n-channel MOS transistor 40; low-voltage n-channel MOS transistors 41 to 48; a low-voltage p-channel MOS transistor 49; and a capacitor element 50.

A control signal BLS is supplied to a gate of the transistor 40, and a first end of the transistor 40 is connected to the corresponding bit line BL. A control signal BLC is supplied to a gate of the transistor 41. A first end of the transistor 41 is connected to a second end of the transistor 40, and a second end of the transistor 41 is connected to a node SCOM. The transistor 41 is used to clamp the corresponding bit line BL at a potential according to the control signal BLC. A control signal BLX is supplied to a gate of the transistor 42. A first end of the transistor 42 is connected to the node SCOM, and a second end of the transistor 42 is connected to a node SSRC.

A control signal XXL is supplied to a gate of the transistor 43. A first end of the transistor 43 is connected to the node SCOM, and a second end of the transistor 43 is connected to a node SEN. A control signal HLL is supplied to a gate of the transistor 44. A first end of the transistor 44 is connected to the node SSRC, and a second end of the transistor 44 is connected to the node SEN. A gate of the transistor 45 is connected to a node INV. A first end of the transistor 45 is connected to the node SCOM, and a second end of the transistor 45 is connected to a node SRCGND.

A control signal BLQ is supplied to a gate of the transistor 46. A first end of the transistor 46 is connected to the node SEN, and a second end of the transistor 46 is connected to a bus LBUS. A gate of the transistor 47 is connected to the node SEN, and a clock CLK is input to a first end of the transistor 47. A control signal STB is supplied to a gate of the transistor 48. A first end of the transistor 48 is connected to a second end of the transistor 47, and a second end of the transistor 48 is connected to the bus LBUS. A gate of the transistor 49 is connected to a node INV. A first end of the transistor 49 is connected to the node SSRC, and a second end of the transistor 49 is connected to a power source terminal. A first end of the capacitor element 50 is connected to the node SEN, and the clock CLK is input to a second end of the capacitor element 50.

The latch circuit SDL includes low-voltage n-channel MOS transistors 51 to 54, and low-voltage p-channel MOS transistors 55 to 58.

A control signal STL is supplied to a gate of the transistor 51. A first end of the transistor 51 is connected to the bus LBUS, and a second end of the transistor 51 is connected to a node LAT. A control signal STI is supplied to a gate of the transistor 52. A first end of the transistor 52 is connected to the bus LBUS, and a second end of the transistor 52 is connected to a node INV. A gate of the transistor 53 is connected to the node INV. A first end of the transistor 53 is connected to a ground terminal, and a second end of the transistor 53 is connected to the node LAT.

A gate of the transistor 54 is connected to the node LAT. A first end of the transistor 54 is connected to the ground terminal, and a second end of the transistor 54 is connected to the node INV. A gate of the transistor 55 is connected to the node INV, and a first end of the transistor 55 is connected to the node LAT. A gate of the transistor 56 is connected to the node LAT, and a first end of the transistor 56 is connected to the node INV. A control signal SLL is supplied to a gate of the transistor 57. A first end of the transistor 57 is connected to a second end of the transistor 55, and a second end of the transistor 57 is connected to the power source terminal. A control signal SLI is supplied to a gate of the transistor 58. A first end of the transistor 58 is connected to a second end of the transistor 56, and a second end of the transistor 58 is connected to the power source terminal.

In the latch circuit SDL, the transistors 53 and 55 form a first inverter, and the transistors 54 and 56 form a second inverter. An output of the first inverter and an input (the node LAT) of the second inverter are connected to the bus LBUS through the transistor 51. An input of the first inverter and an output (the node INV) of the second inverter are connected to the bus LBUS through the transistor 52 for transferring data. The latch circuit SDL stores data at the node LAT, and the inverted data at the node INV.

The sense amplifier module 12 further includes a low-voltage p-channel transistor 59 used for precharging. A control signal PCn is supplied to a gate of the transistor 59. A first end of the transistor 59 is connected to the bus LBUS, and a second end of the transistor 59 is connected to the power source terminal.

A voltage Vdd is applied to the power source terminal connected to the transistors 49, 57, 58, and 59. For example, Vdd is 2.5 V. A voltage Vss is applied to the ground terminal connected to the transistors 53 and 54. For example, Vss is 0V. For example, a voltage applied to the node SRCGND is Vss. The values of the voltages Vdd and Vss are not limited to these values, and can be modified to various values.

[1-2] Operation

[1-2-1] Select Transistor ST1

The operation of the select transistor ST1 will be described with reference to FIGS. 5A to 7B. FIGS. 5A to 7B illustrate flow of carriers in one select transistor ST1. In the following description, a voltage Vg is applied to the gate of the select transistor ST1, a bit-line voltage Vbl is applied to the bit line BL, and a well voltage Vcw is applied to the well line CPWELL. The following description also applies to the memory cell transistors MT and the select transistor ST2.

The semiconductor pillar 27 is made of undoped polysilicon or the like, and does not include a source-drain diffusion layer. Accordingly, electron current or hole current flows through the semiconductor pillar 27. An electron current flows during a read operation, and a hole current flows during an erase operation.

Threshold voltages Vthn and Vthp of the select transistor ST1 increase to the extent that the number of electrons retained by the charge storage layer 25 increases. Vthn is a threshold voltage of the select transistor ST1 when the electron current flows. Vthp is a threshold voltage of the select transistor ST1 when the hole current flows.

The threshold voltages Vthn and Vthp of the written select transistor ST1 are respectively greater than the threshold voltages Vthn and Vthp of the erased select transistor ST1. When a write operation is performed on the erased select transistor ST1, and electrons are injected into the charge storage layer 25, the erased select transistor ST1 turns into the written select transistor ST1.

Figure 5A:
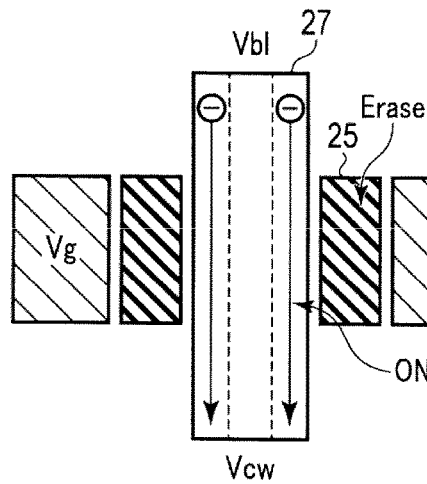
FIGS. 5A and 5B are schematic diagrams each illustrating an operation of a select transistor of the semiconductor memory device according to the first embodiment.
Figure 5B:
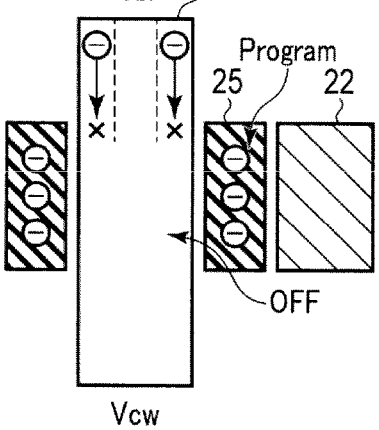

FIGS. 5A and 5B illustrate flow of electrons in one select transistor ST1. The select transistor ST1 operates like an n-channel MOS transistor, in that a current does not flow easily through the written select transistor ST1, and a current flows easily through the erased select transistor ST1. The following description assumes that Vbl is less than Vcw.

As illustrated in FIG. 5A, for example, when the select transistor ST1 is in an erased state, and Vg−Vbl is greater than or equal to Vthn, the select transistor ST1 allows the flow of electrons. Allowing the flow of electrons implies forming a current path for electrons. The prevention of the flow of electrons implies shutting off a current path for electrons. In this case, the current resulting from electron carriers (i.e., holes) supplied from the source line CELSRC flows through the select transistor ST1. Accordingly, a current path is formed in the semiconductor pillar 27, and the well voltage Vcw is transferred to the bit line BL.

As illustrated in FIG. 5B, when data has been written to the select transistor ST1, and Vg−Vbl is less than Vthn, the select transistor ST1 prevents the flow of electrons. In this case, the select transistor ST1 shuts off a current path for electrons supplied from the bit line BL.

Figure 6A:
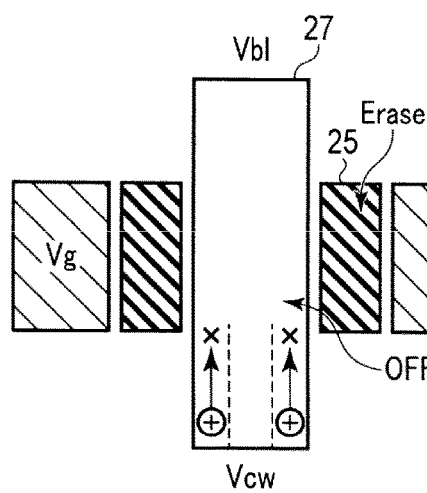
FIGS. 6A and 6B are schematic diagrams each illustrating an operation of the select transistor of the semiconductor memory device according to the first embodiment.
Figure 6B:
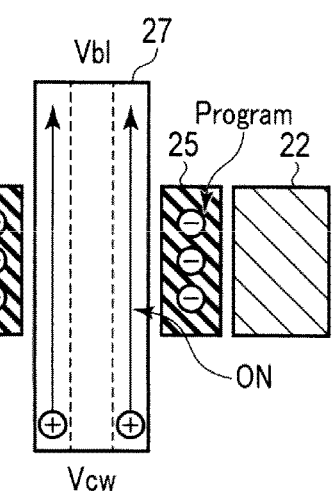

FIGS. 6A and 6B illustrate flow of holes in one select transistor ST1. The select transistor ST1 operates like a p-channel MOS transistor, in that a current flows easily through the written select transistor ST1, and a current does not flow easily through the erased select transistor ST1.

As illustrated in FIG. 6A, for example, when the select transistor ST1 is in an erased state, and Vg−Vcw is greater than Vthp, the select transistor ST1 prevents the flow of holes. Allowing the flow of holes implies forming a current path for holes. The prevention of the flow of holes implies shutting off a current path for holes. In this case, the select transistor ST1 shuts off a current path for holes supplied from the well line CPWELL. The condition Vg−Vcw>Vthp, however, may not be sufficient to shut off all current flow through the select transistor ST1. For example, when the conditions of both FIG. 5A and FIG. 6A are simultaneously satisfied, the select transistor ST1 is capable of shutting off the flow of holes supplied from the well line CPWELL, but is not capable of shutting off the flow of electrons supplied from the bit line BL. This operation will be described in detail later.

As illustrated in FIG. 6B, for example, when data has been written to the select transistor ST1, and Vg−Vcw is less than or equal to Vthp, the select transistor ST1 allows the flow of holes. In this case, the current resulting from holes supplied from the well line CPWELL flows through the select transistor ST1. Accordingly, a current path is formed in the semiconductor pillar 27, and the well voltage Vcw is transferred to the bit line BL.

When Vbl is deemed to be greater than Vcw, and Vg−Vcw is greater than or equal to Vthn, the select transistor ST1 allows the flow of electrons. In contrast, when Vg−Vcw is less than Vthn, the select transistor ST1 prevents the flow of electrons. When Vg−Vbl is greater than Vthp, the select transistor ST1 prevents the flow of holes. In contrast, when Vg−Vbl is less than or equal to Vthp, the select transistor ST1 allows the flow of holes. FIGS. 7A and 7B illustrate flow of electrons and holes in the select transistor ST1, and a condition is added to the voltage condition illustrated in FIG. 6A. The voltage condition illustrated in FIG. 6A is Vg−Vcw>Vthp, where the select transistor ST1 prevents the flow of holes.

As illustrated in FIG. 7A, when Vg−Vbl is greater than or equal to Vthn, the select transistor ST1 allows the flow of electrons. In this case, the current resulting from electron carriers supplied from the bit line BL flows through the select transistor ST1. The electrons passing through the select transistor ST1 are recombined with the holes supplied from the well line CPWELL. Accordingly, a current path is formed in the semiconductor pillar 27, and a voltage is transferred between the bit line BL and the well line CPWELL.

As illustrated in FIG. 7B, when Vg−Vbl is less than Vthn, the select transistor ST1 prevents the flow of electrons. In this case, the select transistor ST1 shuts off the flow of electrons supplied from the bit line BL and the flow of holes supplied from the well line CPWELL. When the select transistor ST1 shuts off the flow of electrons and holes in this manner, a relationship between Vthn, Vthp, Vg, Vbl, and Vcw is represented by the following expression.

$$Vg-Vbl<Vthn$$

$$Vg-Vcw>Vthp$$

$$Vthp+Vcw<Vg<Vthn+Vbl$$

The difference between the threshold voltage Vthn of electrons and the threshold voltage Vthp of holes in the select transistor ST1 is represented by an expression Δnp=Vthn−Vthp>0 V. During a write operation according to the first embodiment, for example, Vbl is set as 0 V, and Vcw is set to satisfy an expression Δnp−Vcw>0. At this time, a relationship between Vthn and Vg is represented by the following expression.

$$Vthn-\Delta np+Vcw<Vg<Vthn$$

This expression can be modified as follows.

$$Vg<Vthn<Vg+\Delta np-Vcw$$

That is, the select transistor ST1 prevents the flow of electrons and holes when Vthn is in the range of Vg<Vthn<Vg+Δnp−Vcw.

A patent regarding the controlling of hole current by a gate voltage is disclosed in U.S. patent application Ser. No. 12/694,690 entitled "non-volatile semiconductor memory device," filed on Jan. 27, 2010. The entire content of this patent application is incorporated in this disclosure by reference. This application illustrates that there is a correlation between Vthn and Vthp, and the difference between Vthn and Vthp is substantially constant.

A change in the threshold voltage Vthn of the select transistor ST1 during a write operation according to the first embodiment will be described with reference to FIG. 8.

It is possible to narrow the threshold voltage distribution of the select transistor ST1 by writing data thereto. Hereinafter, the write of data to the select transistor ST1 is referred to as an SGD write operation. In the SGD write operation, a high voltage is transferred to the write-protect bit line BL, and a write-target bit line BL is maintained at a low voltage, for example, Vss. When a write voltage Vpgm is applied to the select gate line SGD, data is written to the select transistor ST1 connected to the write-target bit line BL if a voltage transferred to the write-target bit line BL is sufficiently high. A high voltage (Vpgm−Vss) is applied to the tunnel oxide film 26, and data is written to the select transistor ST1 connected to the write-target bit line BL. An example of the SGD write operation is disclosed in Japanese Patent Application No. 2012/136739 entitled "non-volatile semiconductor memory device," filed on Jun. 18, 2012. The entire content of this patent application is incorporated in this disclosure by reference.

During a write operation of the semiconductor memory device 1 according to the first embodiment, when a high voltage is transferred to the write-protect bit line BL, the aforementioned characteristic of the select transistor ST1 is used in a range of Vg<Vthn<Vg+Δnp−Vcw and in a range of Vg+Δnp−Vcw≤Vthn. That is, the select transistor ST1 controls the hole current in a state where the flow of electrons is prevented.

Specifically, when a range of Vg<Vthn<Vg+Δnp−Vcw is satisfied, the write-target bit line BL is maintained a low voltage by using the characteristic of the select transistor ST1 preventing the flow of electrons and holes. In contrast, when a range of Vg+Δnp−Vcw≤Vthn is satisfied, a high voltage is transferred to the write-protect bit line BL from the well line CPWELL by using the characteristic of the select transistor ST1 preventing the flow of electrons and allowing the flow of holes.

As described above, according to the value of Vthn of the select transistor ST1, it is determined whether a high voltage is transferred to the bit line BL. Accordingly, it is possible to determine the write or the write-protect status of the select transistor ST1. Due to the write operation, the threshold voltage distribution of the select transistor ST1 increases to a level greater than or equal to Vg+Δnp−Vcw.

When Vthn is less than or equal to Vg, the select transistor ST1 allows the flow of electrons, and prevents the flow of holes. In this case, a high voltage is transferred to the bit line BL from the source line CELSRC, and thus the corresponding select transistor ST1 is write-protected. This area is positioned lower than a write target level of the select transistor ST1, and in the write operation according to the embodiment, data cannot be written to this area of the select transistor ST1. As a result, this area is a cause of a write failure of the select transistor ST1. For this reason, the value of Vg in the write operation is desirably set to be less than a lower end value of the threshold voltage distribution of the select transistor ST1 before data is written thereto.

[1-2-2] Write Operation

Figure 9:
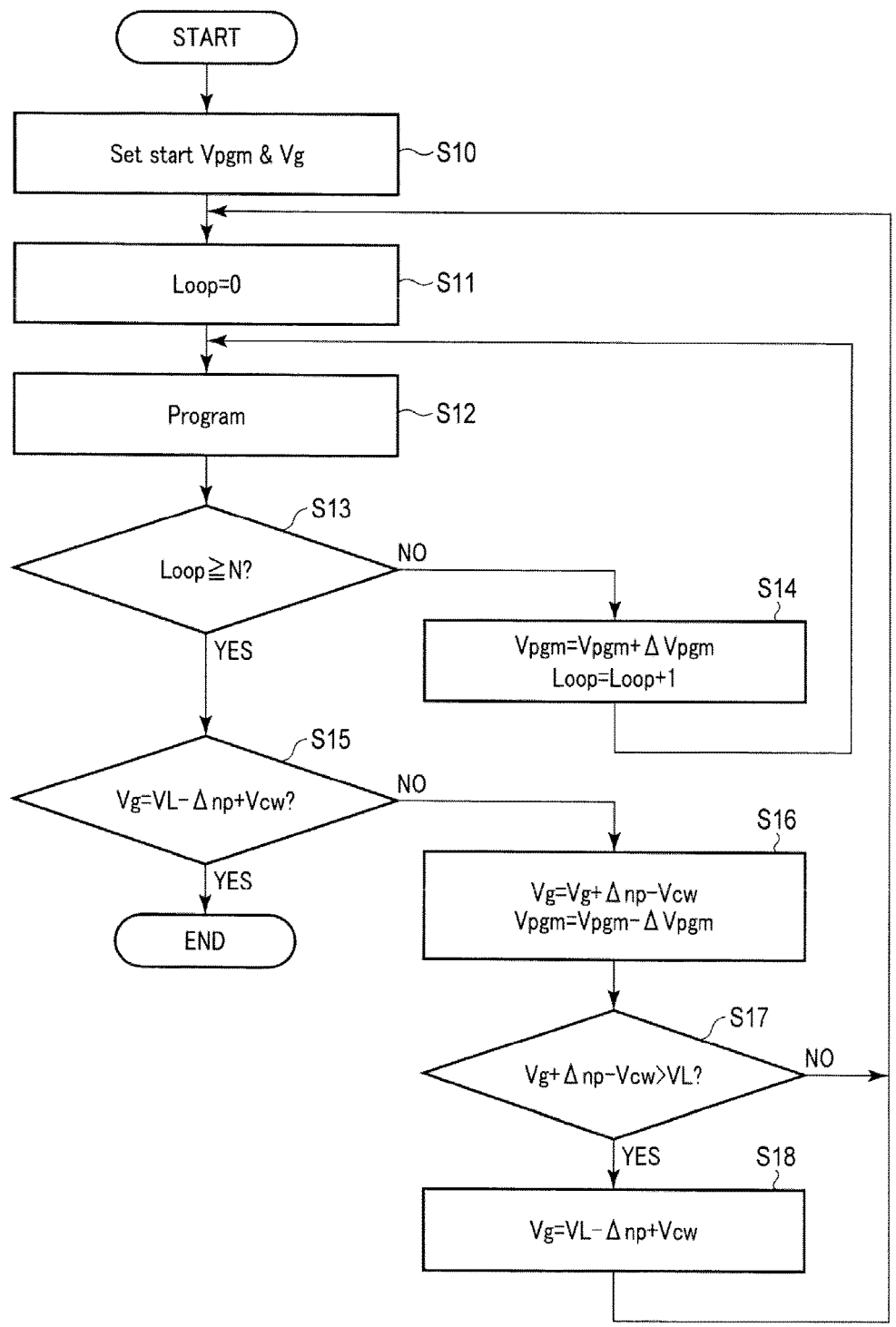
FIG. 9 is a flowchart illustrating a write operation of the semiconductor memory device according to the first embodiment.

The flow of the write operation of the semiconductor memory device 1 according to the first embodiment will be described with reference to FIG. 9.

First, the sequencer 14 sets initial values of the program voltage Vpgm and the voltage Vg (step S10). For example, the initial value of Vpgm is, for example, 15 V, and is set as a high voltage at which electrons flowing through the semiconductor pillar 27 can be injected into the charge storage layer 25. The initial value of Vg is set as a value in the vicinity of a lower end of the threshold voltage distribution. This value is determined by measurements, evaluations, and the like, in advance.

Subsequently, the sequencer 14 resets the number of write loops (step S11). The number of write loops represents the number of repetitions of step S12.

Subsequently, the sequencer 14 writes data to a selected page (step S12). The selected page includes multiple select transistors ST1. A voltage application timing condition in the write operation will be described later.

Subsequently, the sequencer 14 determines whether the number of write loops is greater than or equal to N (N is an integer greater than or equal to zero) (step S13). The number of repetitions of step S12, that is, N can be set as an arbitrary number.

When the number of write loops is less than N (NO in step S13), the sequencer 14 increments Vpgm by ΔVpgm and the number of write loops (step S14). The sequencer 14 returns to step S12, and repeats a write loop of steps S12 to S14. ΔVpgm, which is an incremental value of Vpgm, can be set as an arbitrary value.

When the number of write loops is greater than or equal to N (YES in step S13), the sequencer 14 determines whether Vg=VL−Δnp+Vcw is satisfied (step S15). VL is the write target level of the select transistor ST1. Vcw corresponds to the value of a voltage applied to the well line CPWELL when Vg is applied to the select gate line SGD in a BL charge operation (to be described later). When Vg=VL−Δnp+Vcw is not satisfied (NO in step S15), the sequencer 14 increments Vg by the value of Δnp−Vcw, and decrements Vpgm by ΔVpgm (step S16). Δnp−Vcw, which is an incremental value of Vg, corresponds to the width of an expected threshold voltage increased by the repetition of the aforementioned write loop. An incremental value of Vg is not limited to this value, and for example, may be set as a value less than Δnp−Vcw. The sequencer 14 may not decrement Vpgm, and a decremental value is not limited to ΔVpgm.

Subsequently, the sequencer 14 determines whether Vg+Δnp−Vcw exceeds VL (step S17).

When Vg+Δnp−Vcw is less than or equal to VL (NO in step S17), the sequencer 14 returns to step S11, resets the number of write loops, and repeats a write loop of steps S12 to S14 again.

When this operation is repeated and Vg+Δnp−Vcw exceeds VL (YES in step S17), the sequencer 14 sets VL−Δnp+Vcw as Vg (step S18). The sequencer 14 returns to step S11, resets the number of write loops, and repeats a write loop of steps S12 to S14 again.

In step S15, when Vg=VL−Δnp+Vcw is satisfied (YES in step S15), the sequencer 14 ends the write operation.

As described above, after the write loop, the sequencer 14 increments Vg, and executes the write loop again. Vg is incremented multiple times. A change in the threshold voltage distribution of the select transistor ST1 due to a write operation of the semiconductor memory device 1 in the first embodiment will be described with reference to FIGS. 10A to 10D. FIGS. 10A to 10D illustrate an example in which Vg is incremented three times in step S16, and the threshold voltage distribution of the select transistor ST1 increases to a level greater than or equal to VL.

Figure 10A:
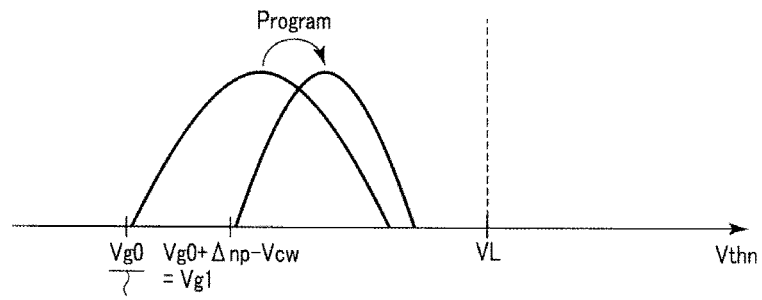
FIGS. 10A to 10D are diagrams illustrating changes in threshold voltage distributions of the select transistor when the semiconductor memory device operates according to the first embodiment.

FIG. 10A illustrates threshold voltage distributions of the select transistor ST1 before and after the repetition of N times of a write loop of steps S12 to S14 when an initial value of Vg is set as Vg0. When the write loop is repeated using Vg0, the threshold voltage distribution of the select transistor ST1 increases to a level greater than or equal to Vg0+Δnp−Vcw. The value of Vg0+Δnp−Vcw is assumed to be Vg1.

Figure 10B:
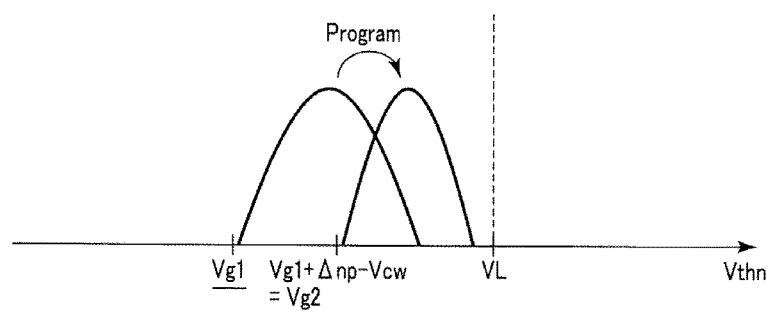

FIG. 10B illustrates threshold voltage distributions of the select transistor ST1 before and after the repetition of N times of a write loop of steps S12 to S14 when the value of Vg is set as Vg1 subsequent to the write operation illustrated in FIG. 10A. When the write loop is repeated using Vg1, the threshold voltage distribution of the select transistor ST1 increases to a level greater than or equal to Vg1+Δnp−Vcw. The value of Vg1+Δnp−Vcw is assumed to be Vg2.

Figure 10C:
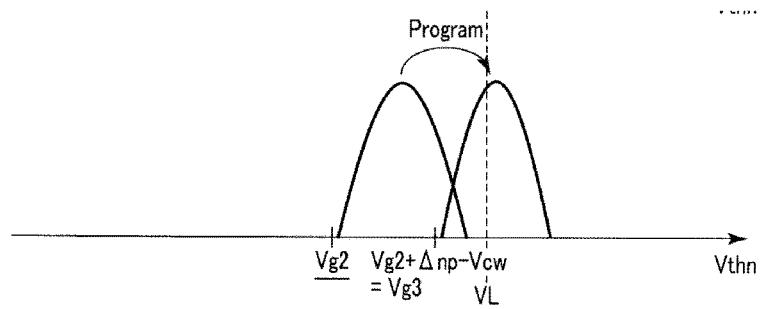

FIG. 10C illustrates threshold voltage distributions of the select transistor ST1 before and after the repetition of N times of a write loop of steps S12 to S14 when the value of Vg is set as Vg2 subsequent to the write operation illustrated in FIG. 10B. When the write loop is repeated using Vg2, the threshold voltage distribution of the select transistor ST1 increases to a level greater than or equal to Vg2+Δnp−Vcw. The value of Vg2+Δnp−Vcw is assumed to be Vg3.

Figure 10D:
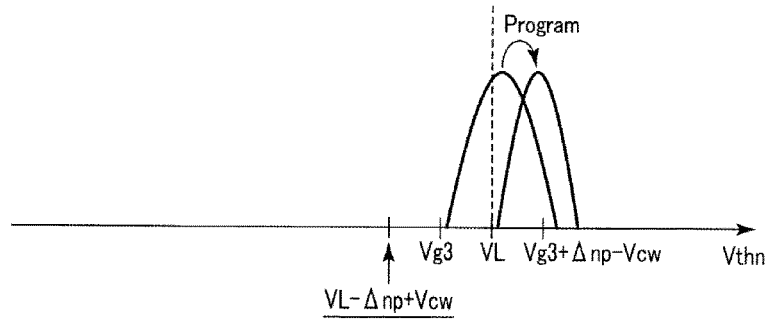

As illustrated in FIG. 10D, when a set value of Vg is Vg3, Vg3+Δnp−Vcw is greater than VL. In this case, the sequencer 14 repeats a write loop of steps S12 to S14 with the value of Vg being set as VL−Δnp−Vcw. Accordingly, the threshold voltage distribution of the select transistor ST1 increases to a level greater than or equal to VL.

As described above, in the write operation of the semiconductor memory device 1 according to the first embodiment, a write loop of steps S12 to S14 is repeated with Vg being incremented, and thus the threshold voltage distribution of the select transistor ST1 is shifted to be greater than or equal to VL.

The number of increments of Vg is not limited to that in the aforementioned description, and is changed according to an initial value of Vg, and the numerical values of VL and Δnp−Vcw. For example, the number of increments of Vg may be one. When the write loop is performed, the select transistor ST1 with a threshold voltage of Vg is included in a non-writable area, and thus an incremental numerical value may be set to be slightly less than Δnp−Vcw.

A voltage application timing condition in a write operation of the semiconductor memory device 1 according to the first embodiment will be described with reference to FIG. 11. Between write operations, the voltages of the select gate lines SGD (USGD) not selected in a selected block and a non-selected block are "maintained at Vss, and the voltage of the select gate line SGS (USGS) not selected in a non-selected block is maintained at Vss. The voltage of the node SRCGND is maintained at Vss.

First, the sequencer 14 performs a BL discharge operation. In the BL discharge operation, the voltage of the bit line BL is set as Vss.

At time t0, the sequencer 14 turns on the transistors 40 and 41 by setting the voltage of the control signal BLS as VHH, and the voltage of the control signal BLC as Vdd. VHH and Vdd are voltages at which the transistors 40 and 41 are turned on, and can be changed to various voltage values. Since the node INV is set to an "H" level, at this time, the transistor 45 is turned on, and the bit line BL is connected to the node SRCGND. Accordingly, the voltage of the bit line BL becomes Vss.

The sequencer 14 sets the voltages of the control signals BLS and BLC as Vss at time t1. Accordingly, the sense amplifier module 12 is not electrically connected to the bit line BL, and the bit line BL is brought into a floating state. The floating state implies a state in which the bit line BL is electrically shut off.

Subsequently, the sequencer 14 performs a BL charge operation. The BL charge operation is performed before the write voltage Vpgm is applied to the select gate line SGD in a write operation. A high voltage is transferred to the write-protect bit line BL in the BL charge operation.

At time t2, the sequencer 14 turns on the select transistor ST2 and the memory cell transistors MT by setting the voltages of the select gate line SGS and the word line WL as Vusel. Vusel is a voltage at which a hole current flows through the memory cell transistors MT and the select transistors ST1 and ST2, and for example, is set as Vss or a value less than or equal as 0 V. Vusel satisfies Vusel−Vblh<Vthp. Vblh is a voltage that is transferred from the well line CPWELL to the write-protect bit line BL, and for example, is 4 V. The sequencer 14 sets the voltage of the source line CELSRC and the voltage Vcw of the well line CPWELL as Vblh−Vg. Vblh satisfies Vblh−Vg>0. Vblh is not limited to the aforementioned range, and need not satisfy Vblh−Vg>0.

At time t3, the sequencer 14 sets the voltage of the source line CELSRC and the voltage Vcw of the well line CPWELL as Vblh. The sequencer 14 sets the voltage of the select gate line SGD as Vg. At this time, the select transistor ST1, of which the threshold voltage Vthn satisfies Vg<Vthn<Vg+Δnp−Vcw, is turned on, and the select transistor ST1, of which the threshold voltage Vthn satisfies Vg+Δnp−Vcw≤Vthn, is turned off. Accordingly, Vblh is transferred from the well line CPWELL to the write-protect bit line BL, and the voltage of the write-protect bit line BL increases to Vblh. In contrast, since the select transistor ST1 corresponding to the write-target bit line BL is turned off, the voltage of the write-target bit line BL is maintained at Vss. An initial value of Vg is set to be greater than Vusel.

At time t4, the sequencer 14 sets the voltage of the select gate line SGD as Vss, and the voltages of the source line CELSRC and the well line CPWELL as Vblh−Vg.

At time t5, the sequencer 14 sets the voltages of the select gate line SGS, the word line WL, the source line CELSRC, and the well line CPWELL as Vss.

Figure 12:
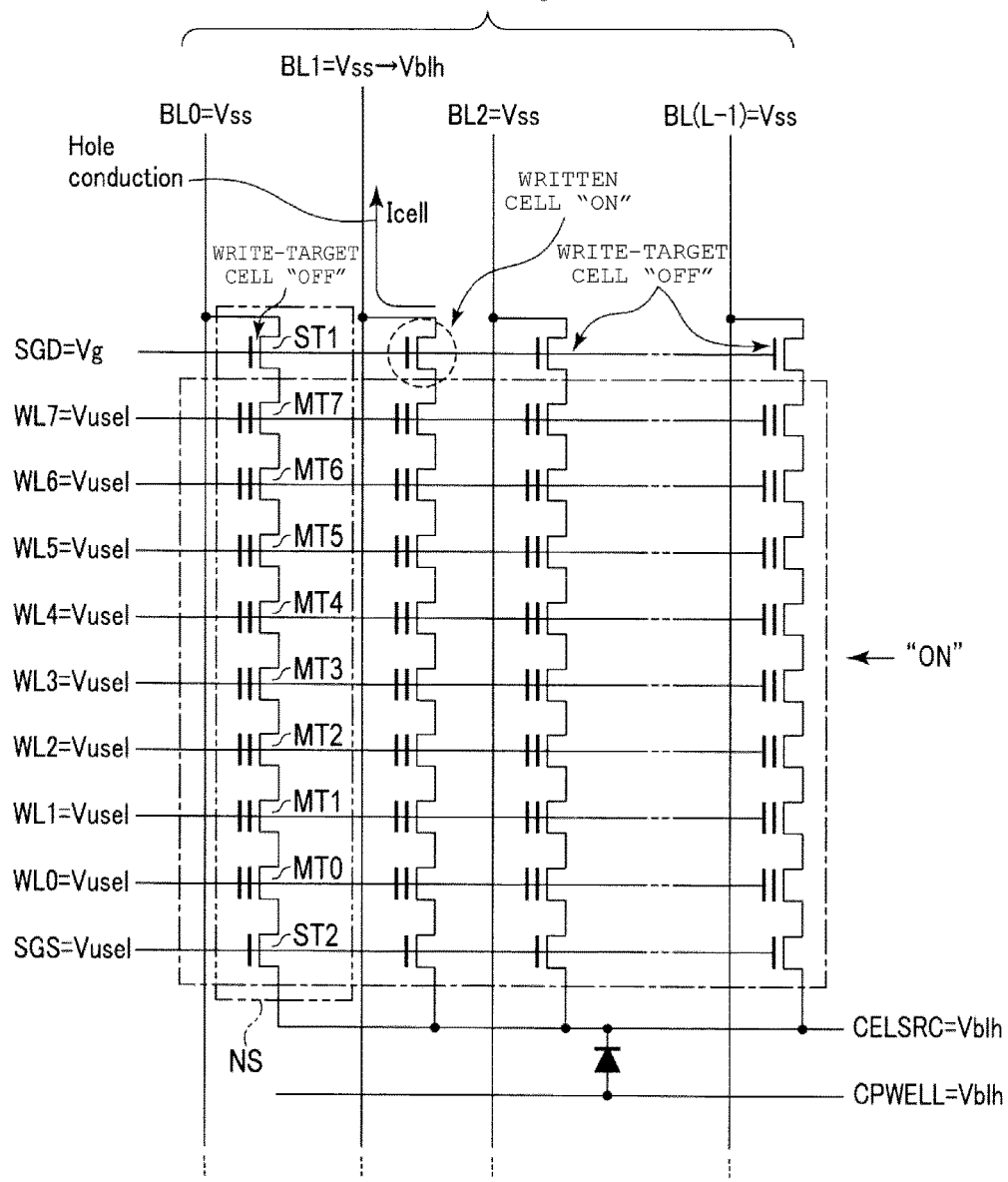
FIG. 12 is a circuit diagram of the memory cell array of the semiconductor memory device according to the first embodiment.

An example of the operation of the memory cell array 10 in a BL charge operation will be described with reference to FIG. 12. FIG. 12 illustrates an example in which the write of data to the select transistor ST1 connected to a bit line BL1 has completed, and a write target is the select transistor ST1 connected to another bit line BL.

All of the bit lines BL are in a floating state at the start of a BL charge operation. When Vg is applied to the select gate line SGD, the select transistor ST1 connected to the bit line BL1 is turned on, and the select transistor ST1 connected to a write-target bit line BL is turned off. If the voltage of the source line CELSRC is set as Vblh at this time, hole current flows from the source line CELSRC to the bit line BL1, and the voltage of the bit line BL1 increases from Vss to Vblh. Accordingly, the bit line BL1 is write-protected. Since the select transistor ST1 connected to the write-target bit line BL is turned off, the write-target bit line BL is maintained at Vss. The voltage of the source line CELSRC is set to be equal to the voltage of the well line CPWELL so as to cancel out an impact on the well line CPWELL.

An SGD write operation will be described with reference again to FIG. 11. In the SGD write operation, data is written to the select transistor ST1 of which the threshold voltage does not exceed Vg+Δnp−Vcw.

At time t6, the sequencer 14 sets the voltages of the select gate line SGD and word line WL as Vpass, and the voltage of the source line CELSRC as Vdd. Vpass is a voltage at which the select transistors ST1 and ST2 and the memory cell transistors MT boost a channel voltage, and for example, is 10 V. The voltage applied to the source line CELSRC prevents the flow of current into the source line CELSRC from the NAND string NS, is not limited to Vdd, and can be changed to various voltage values.

At time t7, the sequencer 14 sets the voltage of the select gate line SGD as Vpgm. Accordingly, a high voltage of Vpgm−Vss is applied to the tunnel oxide film 26, and data is written to the select transistor ST1 connected to the write-target bit line BL. In contrast, a voltage of Vpgm−Vblh is applied to the tunnel oxide film 26 in the select transistor ST1 connected to the write-protect bit line BL. If Vblh is sufficiently high at this time, data is not written to the select transistor ST1.

At time t8, the sequencer 14 sets the voltages of the select gate line SGD, the word line WL, and the source line CELSRC as Vss, the voltage of the control signal BLS as VHH, and the voltage of the control signal BLC as Vdd. Accordingly, the bit line BL is discharged to Vss.

At time t9, the sequencer 14 sets the voltages of the control signals BLS and BLC as Vss, and ends the operation of step S12.

As described above, in the write operation of the semiconductor memory device 1 according to the first embodiment, it is possible to charge the write-protect bit line BL without performing an operation to confirm the threshold voltage of the select transistor ST1.

[1-3] Effects of First Embodiment

In the semiconductor memory device 1, when the select transistor ST1 has the same structure as that of the memory cell transistor MT, it is possible to change the threshold voltage by writing to and erasing data from the select transistor ST1. In the semiconductor memory device 1, it is possible to narrow the threshold voltage distribution by writing data to and verifying the select transistor ST1. When the threshold voltage distribution of the select transistor ST1 is narrowed, the threshold voltage distribution of the written memory cell transistor MT is narrowed. As a result, the reliability of the semiconductor memory device 1 is improved.

When data is written to the select transistor ST1, it is necessary to transfer a high voltage to the write-protect bit line BL. The following two methods are known as methods of writing data to the select transistor ST1.

One method is to use a burn-in mode by which a power source voltage is increased. In this method, the power source voltage is increased such that a high voltage is applied from the sense amplifier module 12, and the write-protect bit line BL is charged. However, this method cannot be realized at a normal operation voltage, and thus this method is limited and can be used only for test, pre-write prior to shipment, and the like. Since the voltage charged to the bit line BL is transferred from the sense amplifier module 12, when a voltage exceeding a withstand voltage is required, the low-voltage transistors of the sense amplifier module 12 are not capable of coping with the voltage.

The other method is to divide one page into even and odd pages, and write data to the select transistors ST1 on each half page. In this method, a normal power source voltage is used, and the sense amplifier module 12 is capable of coping with the power source voltage without being entirely formed of high-voltage transistors. However, since a high voltage is transferred to the write-protect bit line BL, the sense amplifier module 12 requires one high-voltage transistor through which the high voltage is allowed to pass. Since data is written to each half page, a write speed is low. In addition, since the write of data to one page is performed over two times, when data is written to the latter half page, extra disturbance is applied to the select transistor of the former half page previously written.

In the semiconductor memory device 1 according to the first embodiment, when data is written to the select transistor ST1, a high voltage is transferred from the well line CPWELL to the write-protect bit line BL. The characteristic of the select transistor ST1 in a range of Vg<Vthn<Vg+Δnp−Vcw and a range of Vg+Δnp−Vcw≤Vthn is used to identify the write-protect bit line BL, and a verify operation is omitted.

Accordingly, in the semiconductor memory device 1 according to the first embodiment, it is possible to write data to the select transistor ST1 in a full page writing operation, and it is possible to reduce extra disturbance compared to when data is written to the select transistor ST1 in a half page writing operation.

Since the transfer of a high voltage is not required, it is not necessary for the sense amplifier module 12 to be entirely formed of high-voltage transistors. Since a high voltage can be applied to the well line CPWELL for an erase operation, a small number of additional circuits for applying the high voltage Vblh to the well line CPWELL are provided. Accordingly, it is possible to suppress an increase in the area of the semiconductor memory device 1.

[2] Second Embodiment

In the semiconductor memory device 1 according to a second embodiment, in a write operation, a Vg search operation is performed to set Vg as an optimal value. Hereinafter, only differences from the first embodiment will be described.

Figure 13:
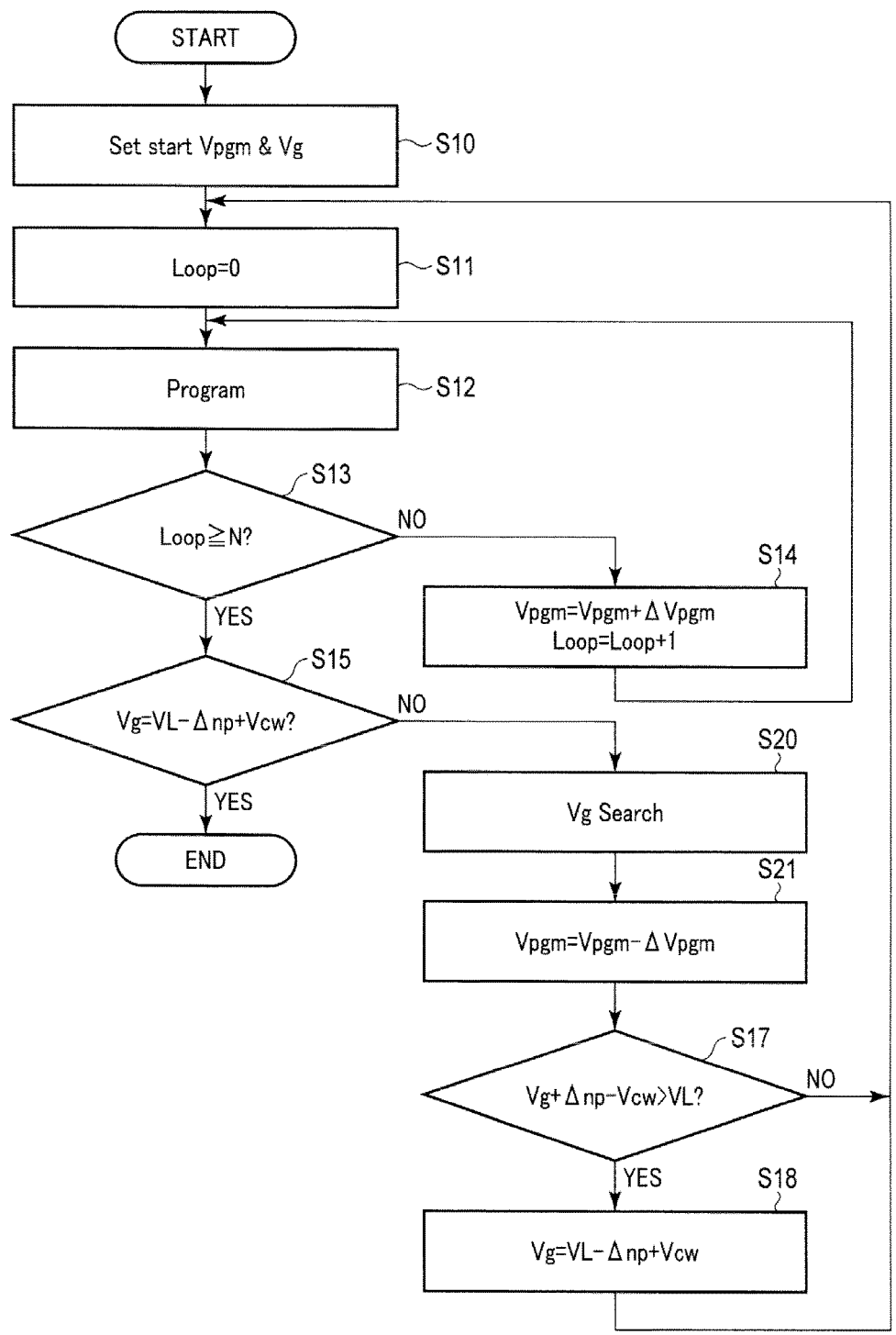
FIG. 13 is a flowchart of a write operation of the semiconductor memory device according to a second embodiment.

The flow of the entire write operation of the semiconductor memory device 1 in the second embodiment will be described with reference to FIG. 13.

When Vg=VL−Δnp+Vcw is not satisfied (NO in step S15), the sequencer 14 performs a Vg search operation (step S20). In the Vg search operation, the sequencer 14 searches the lower end of the threshold voltage distribution of the select transistor ST1, and sets Vg as an optimal value. An optimal value of Vg represents a value less than M (M is an arbitrary number), which is the number of select transistors ST1 that are turned on when Vg is applied to the select gate line SGD selected. The Vg search operation will be described in detail later.

Subsequently, the sequencer 14 decrements Vpgm by ΔVpgm (step S21). Similar to the first embodiment, the sequencer 14 may not decrement Vpgm, and a decremental value is not limited to ΔVpgm.

Subsequently, the sequencer 14 performs step S17. Other operations are the same as in the first embodiment.

The Vg search operation will be described in detail with reference to FIGS. 14A to 14D. FIGS. 14A to 14D illustrate an example of the flow of the Vg search operation.

Figure 14A:
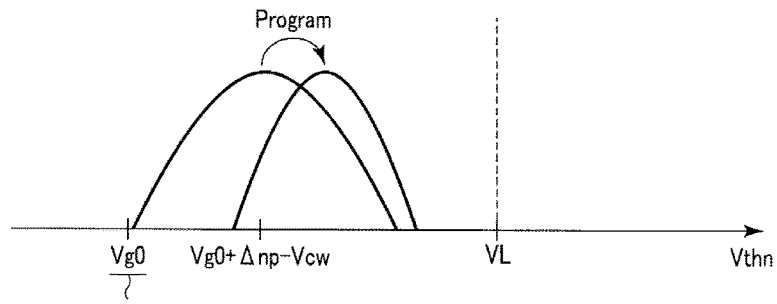
FIGS. 14A to 14D are diagrams illustrating changes in threshold voltage distributions of the select transistor when the semiconductor memory device operates according to the second embodiment.

FIG. 14A illustrates threshold voltage distributions of the select transistor ST1 before and after the repetition of N times of a write loop of steps S12 to S14 when an initial value of Vg is set as Vg0. As illustrated in FIG. 14A, even after the repetition of N times of a write loop of steps S12 and S13, a portion of the threshold voltage distribution of the select transistor ST1 may be less than Vg0+Δnp−Vcw.

Figure 14B:
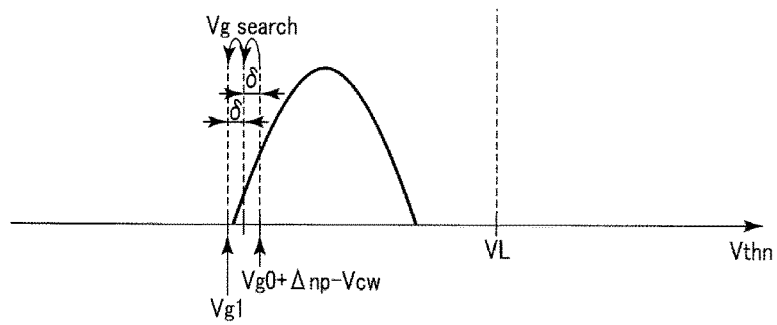

FIG. 14B illustrates a state in which the Vg search operation of step S20 is performed on the select transistor ST1 after writing in FIG. 14A.

First, the sequencer 14 reads the select transistors ST1. The value of a read voltage applied to the select gate line SGD selected is Vg0+Δnp−Vcw. Accordingly, the sequencer 14 detects the number of the select transistors ST1 of which the threshold values are less than or equal to Vg0+Δnp−Vcw.

When the number of select transistors ST1 turned on is greater than or equal to M, the sequencer 14 decreases the read voltage by δ, and performs a read operation again. This operation is repeated until the number of select transistors ST1 turned on is less than M. δ can be set as an arbitrary numerical value.

If the number of select transistors ST1 turned on is less than M, Vg which is used for the next writing loop is set as the voltage Vg1 used in the read operation at this time, the sequencer 14 proceeds to step S21.

Figure 14C:
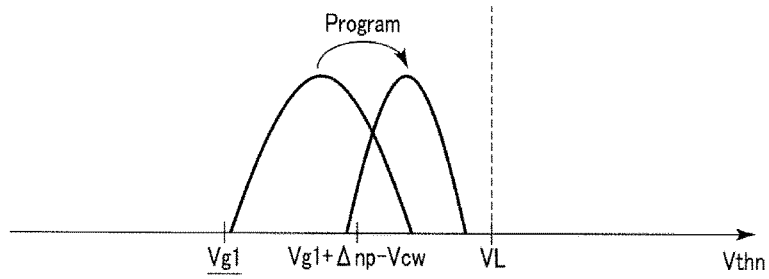

FIG. 14C illustrates threshold voltage distributions of the select transistor ST1 before and after a write loop of steps S12 to S14 is repeated N times when the value of Vg is set as Vg1.

Figure 14D:
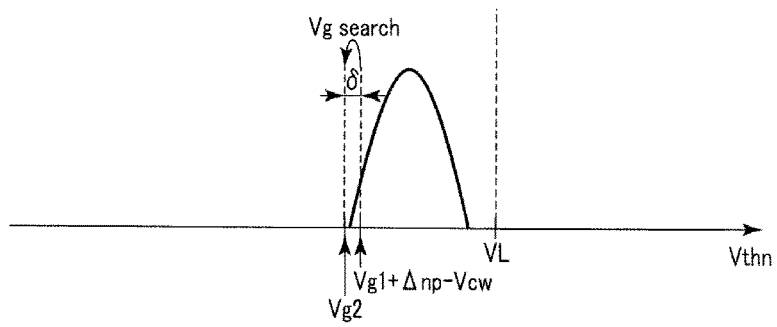

FIG. 14D illustrates a state in which the Vg search operation of step S20 is performed on the select transistor ST1 after writing in FIG. 14C. As illustrated in FIG. 14D, the number of reads in the Vg search operation may be one, and is changed according to the threshold voltage of the select transistor ST1. When the number of reads in the Vg search operation reaches the maximum value in step S20, the sequencer 14 may set any of the voltage used in the read operation as Vg, or may end the write operation as deemed to have failed.

As described above, in the write operation of the semiconductor memory device 1 according to the second embodiment, it is possible to set Vg as an optimal value by performing the Vg search operation. Accordingly, it is possible to reduce the occurrence of a write failure of the select transistor ST1, and to improve the reliability of the semiconductor memory device 1, as compared to the first embodiment.

[3] Third Embodiment

The semiconductor memory device 1 according to a third embodiment performs a verify operation that is added to the write operation in the first embodiment. Hereinafter, only differences from the first embodiment will be described.

[3-1] Write Operation

Figure 15:
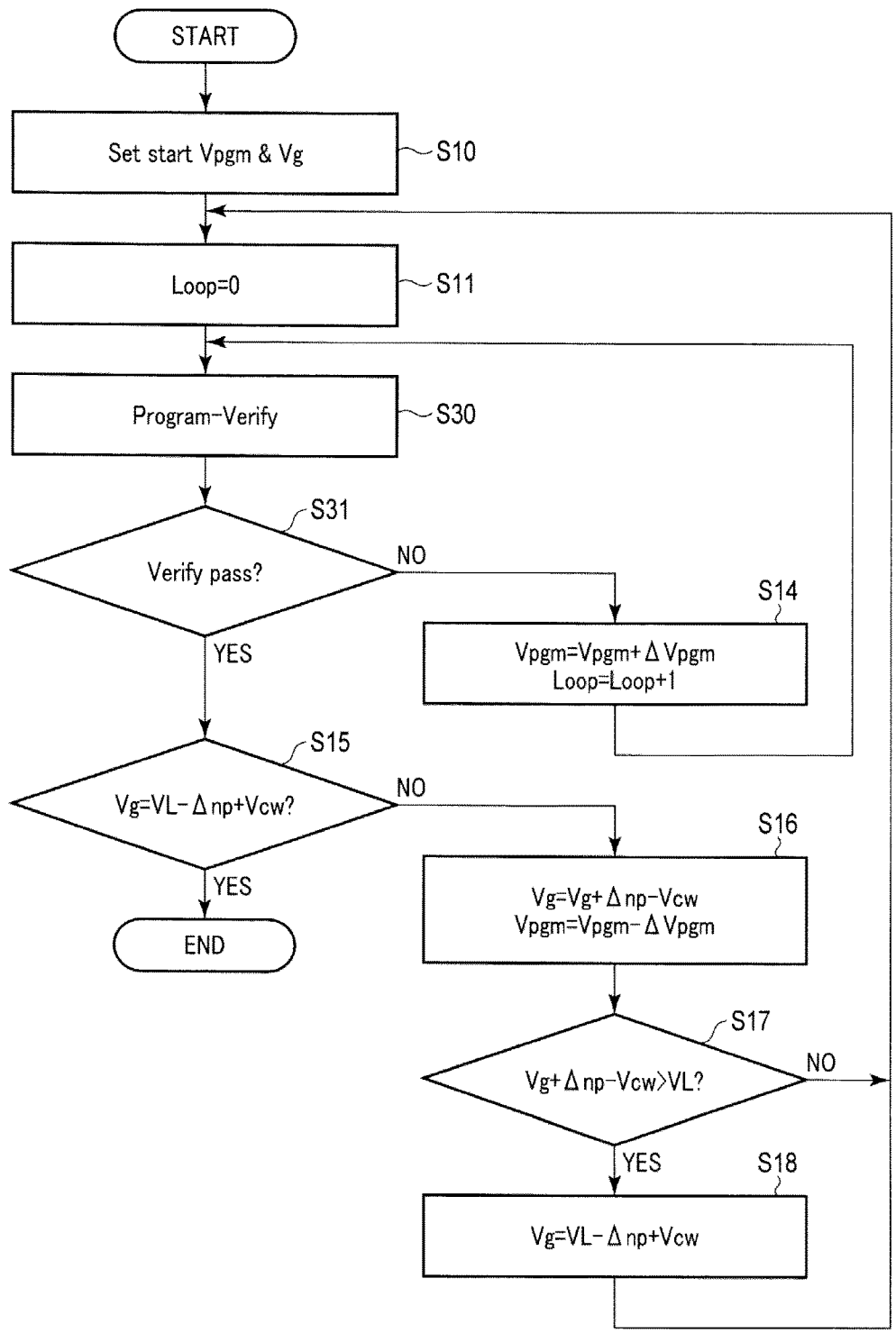
FIG. 15 is a flowchart of a write operation of the semiconductor memory device according to a third embodiment.

The flow of the entire write operation of the semiconductor memory device 1 in the third embodiment will be described with reference to FIG. 15.

The sequencer 14 resets the number of write loops in step S11. In the third embodiment, the number of write loops corresponds to the number of repetitions of a write operation and a verify operation of step S30.

Subsequently, the sequencer 14 performs the write operation and the verify operation (step S30). In step S30, after the write operation, the verify operation is performed to confirm the threshold voltage of the select transistor ST1. In the verify operation, the sequencer 14 determines whether the threshold voltage of a write-target select transistor ST1 exceeds Vg+Δnp−Vcw.

Subsequently, the sequencer 14 determines whether verification has passed (step S31). For example, when the number of select transistors ST1, of which the threshold voltages are determined to be less than or equal to Vg+Δnp−Vcw, is less than a predetermined number in the verify operation, verification is deemed to have passed.

When verification has failed (NO in step S31), the sequencer 14 increments the number of write loops (step S14). The sequencer 14 returns to step S30, and repeats the write loop (a set of the write operation and the verify operation). When the number of write loops is greater than or equal to one, the sequencer 14 writes data to the select transistor ST1 according to a verification result. When the number of write loops reaches the maximum value, the sequencer 14 may end the write operation as deemed to have failed.

When verification has passed (YES in step S31), the sequencer 14 proceeds to step S15. Other operations are the same as in the first embodiment.

A voltage application timing condition in the write operation of the semiconductor memory device 1 according to the third embodiment will be described with reference to FIG.

Figure 16:
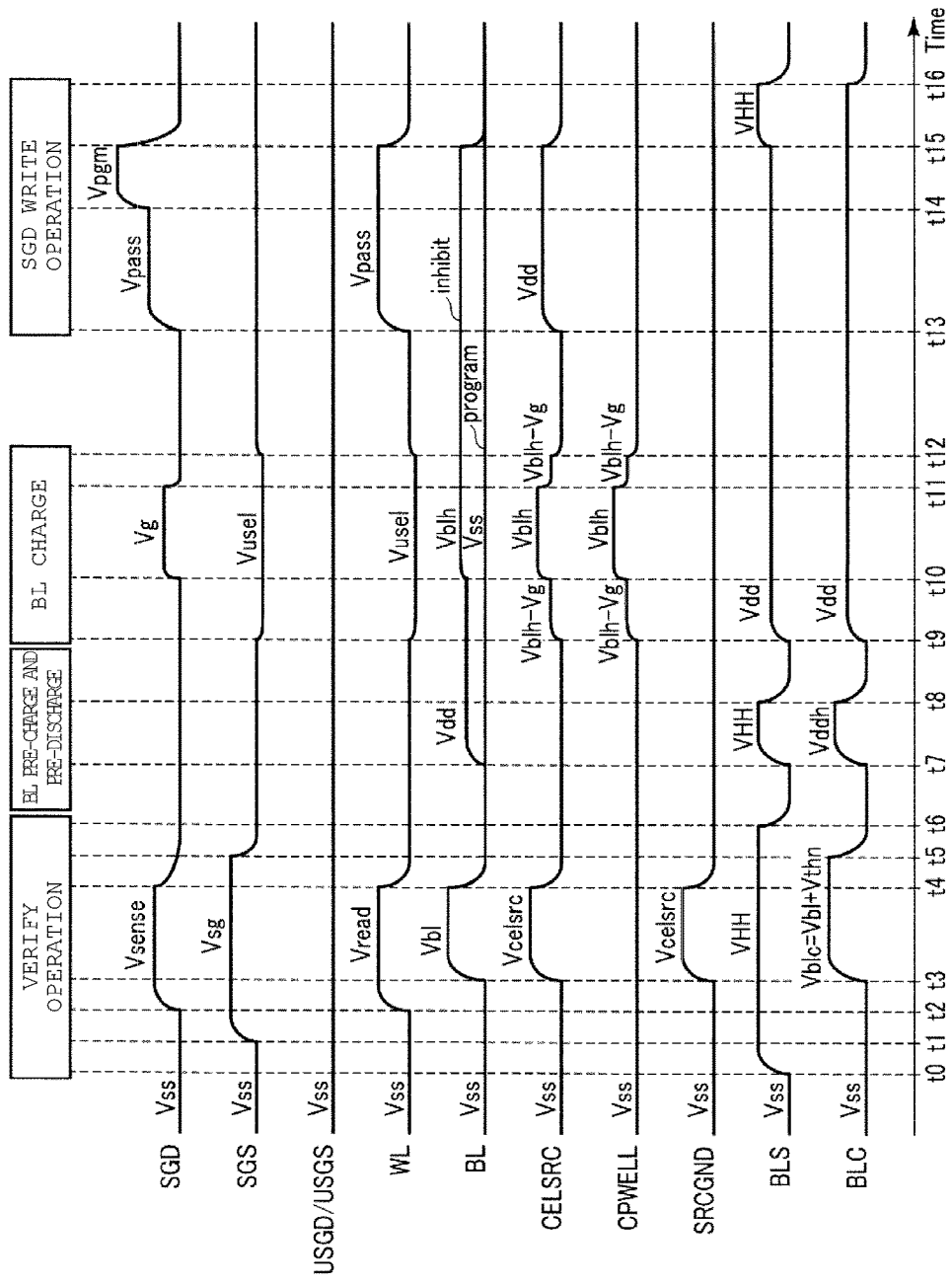
FIG. 16 is a timing chart of the write operation of the semiconductor memory device according to the third embodiment.

16. FIG. 16 illustrates a verify operation prior to a write operation for illustrative purposes.

First, the verify operation will be described.

At time t0, the sequencer 14 turns on the transistor 40 by setting the voltage of the control signal BLS as VHH.

At time t1, the sequencer 14 turns on the select transistor ST2 by setting the voltage of the select gate line SGS as Vsg. Vsg is a voltage at which the select transistors ST1 and ST2 are turned on, and for example, is 4 V.

At time t2, the sequencer 14 sets the voltage of the select gate line SGD as Vsense, and the voltage of the word line WL as Vread. Vsense is a threshold voltage at which data is written to the select transistor ST1 in each write loop, and is equal to Vg+Δnp−Vcw. Vread is a voltage applied to a non-selected word line WL in a read operation, and for example, is 4.5 V.

At time t3, the sequencer 14 sets the voltage of the control signal BLC as Vblc, and the voltages of the node SRCGND and the source line CELSRC as Vcelsrc. The voltage value of Vblc is equal to Vbl+Vthn. Accordingly, the transistor 41 is turned on, and the voltage of the bit line BL increases to Vbl. The sense amplifier module 12 determines a sense result, and cause the latch circuit SDL to retain the result between time t3 and time t4. When verification is passed, the node INV becomes an "L" level, and when verification is failed, the node INV becomes a "H" level. An "L" level voltage is a voltage at which an n-channel MOS transistor is turned off when a control signal is input thereto, and a p-channel MOS transistor is turned on when a control signal is input thereto. An "H" level voltage is a voltage at which an n-channel MOS transistor is turned on when a control signal is input thereto, and a p-channel MOS transistor is turned off when a control signal is input thereto.

At time t4, the sequencer 14 sets the voltage of the select gate line SGD as Vss, and the voltages of the word line WL, the source line CELSRC, and the node SRCGND as Vss. The voltage of the bit line BL falls to Vss at this time.

At time t5, the sequencer 14 turns off the transistor 41 by setting the voltage of the control signal BLC as Vss.

At time t6, the sequencer 14 turns off the transistor 40 by setting the voltage of the control signal BLS as Vss.

Subsequently, a write operation performed based on a verification result will be described.

First, a BL pre-charge and pre-discharge operation will be described.

At time t7, the sequencer 14 turns on the transistors 40 and 41 by setting the voltage of the control signal BLS as VHH, and the voltage of the control signal BLC as Vddh. Vddh is a voltage higher than Vdd, and for example, is equal to Vdd+Vthn.

Since the node INV becomes an "L" level when verification is passed, the transistor 49 is turned on, and the transistor is turned off. Accordingly, Vdd is applied to the write-protect bit line BL from the power source terminal.

Since the node INV becomes an "H" level when verification is failed, the transistor 49 is turned off, and the transistor is turned on. Accordingly, Vss is applied to the write-target bit line BL from the node SRCGND.

At time t8, the sequencer 14 turns off the transistors 40 and 41 by setting the voltages of the control signals BLS and BLC as Vss. Since the sense amplifier module 12 is not electrically connected to the bit line BL at this time, the write-protect bit line BL is floated, and is maintained at Vdd.

Subsequently, a BL charge operation will be described.

At time t9, the sequencer 14 turns on the select transistor ST2 and the memory cell transistors MT by setting the voltages of the select gate line SGS and the word line WL as Vusel. The sequencer 14 sets the voltages of the control signals BLS and BLC as Vdd. Accordingly, the transistor 40 connected to the write-protect bit line BL is turned off, and the transistor 40 connected to the write-target bit line BL is turned on. The sequencer 14 sets the voltages of the source line CELSRC and the well line CPWELL as Vblh−Vg.

At time t10, the sequencer 14 sets the voltages of the source line CELSRC and the well line CPWELL as Vblh. The voltage of the select gate line SGD is set as Vg. At this time, the select transistor ST1 passing verification is turned on, and the select transistor ST1 failing verification is turned off. Accordingly, the transistor 40 is turned off, and the select transistor ST1 is turned on, and thus the voltage of the write-protect bit line BL increases to Vblh. In contrast, Vss is applied from the node SRCGND to the write-target bit line BL, and the select transistor ST1 is turned off, and thus the voltage of the write-target bit line BL is maintained at Vss.

At time t11, the sequencer 14 sets the voltage of the select gate line SGD as Vss. The sequencer 14 sets the voltages of the source line CELSRC and the well line CPWELL as Vblh−Vg.

At time t12, the sequencer 14 turns off the select transistors ST1 and ST2 and the memory cell transistors MT by setting the voltages of the select gate line SGS and the word line WL as Vss. The sequencer 14 sets the voltages of the source line CELSRC and the well line CPWELL as Vss. Since the write-protect bit line BL is floated, the voltage of the write-protect bit line BL is maintained at Vblh. In contrast, since Vss is applied to the write-target bit line BL from the node SRCGND, the voltage of the write-target bit line BL is maintained at Vss.

Figure 11:
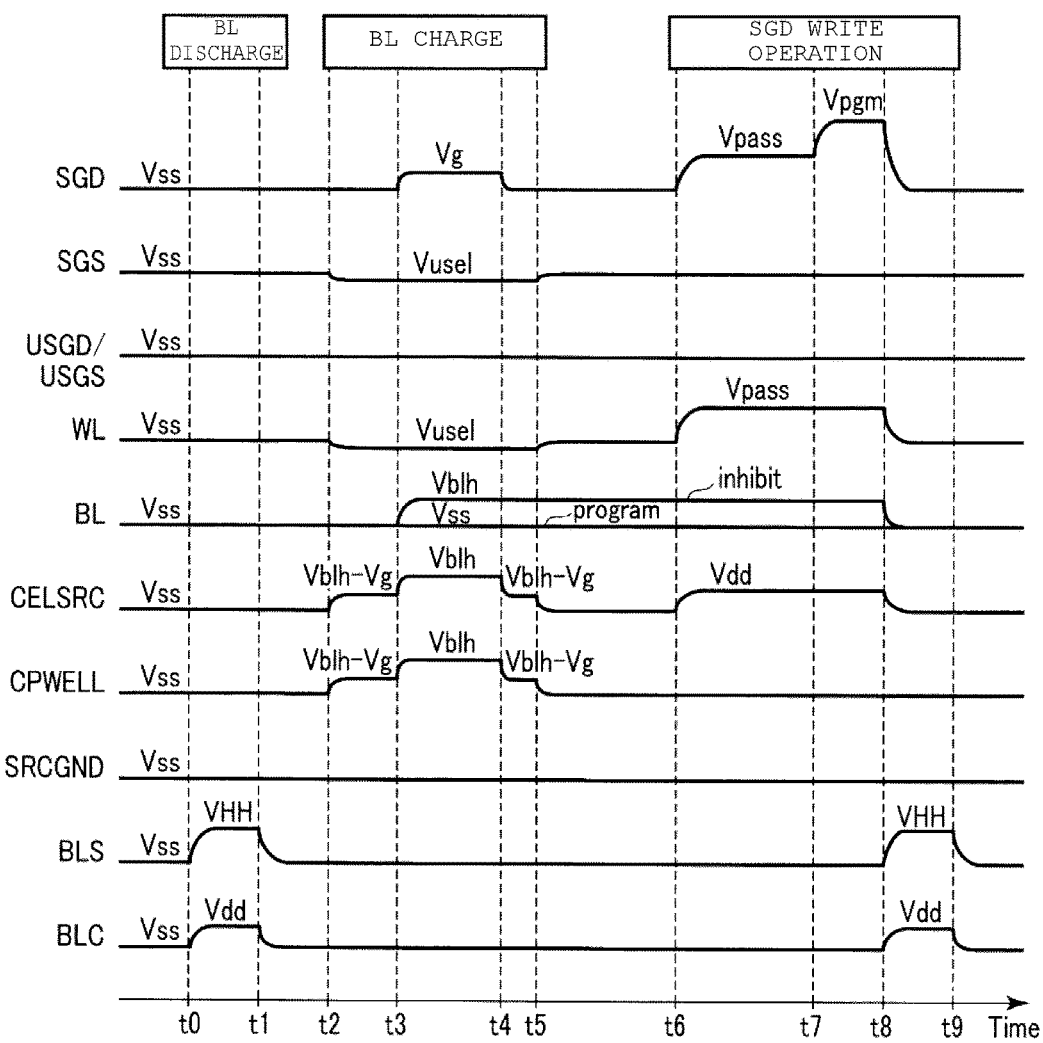
FIG. 11 is a timing chart of the write operation of the semiconductor memory device according to the first embodiment.

An SGD write operation is the same as in the first embodiment, and times t13 to t16 in FIG. 16 correspond to times t6 to t9 in FIG. 11, respectively.

Figure 17:
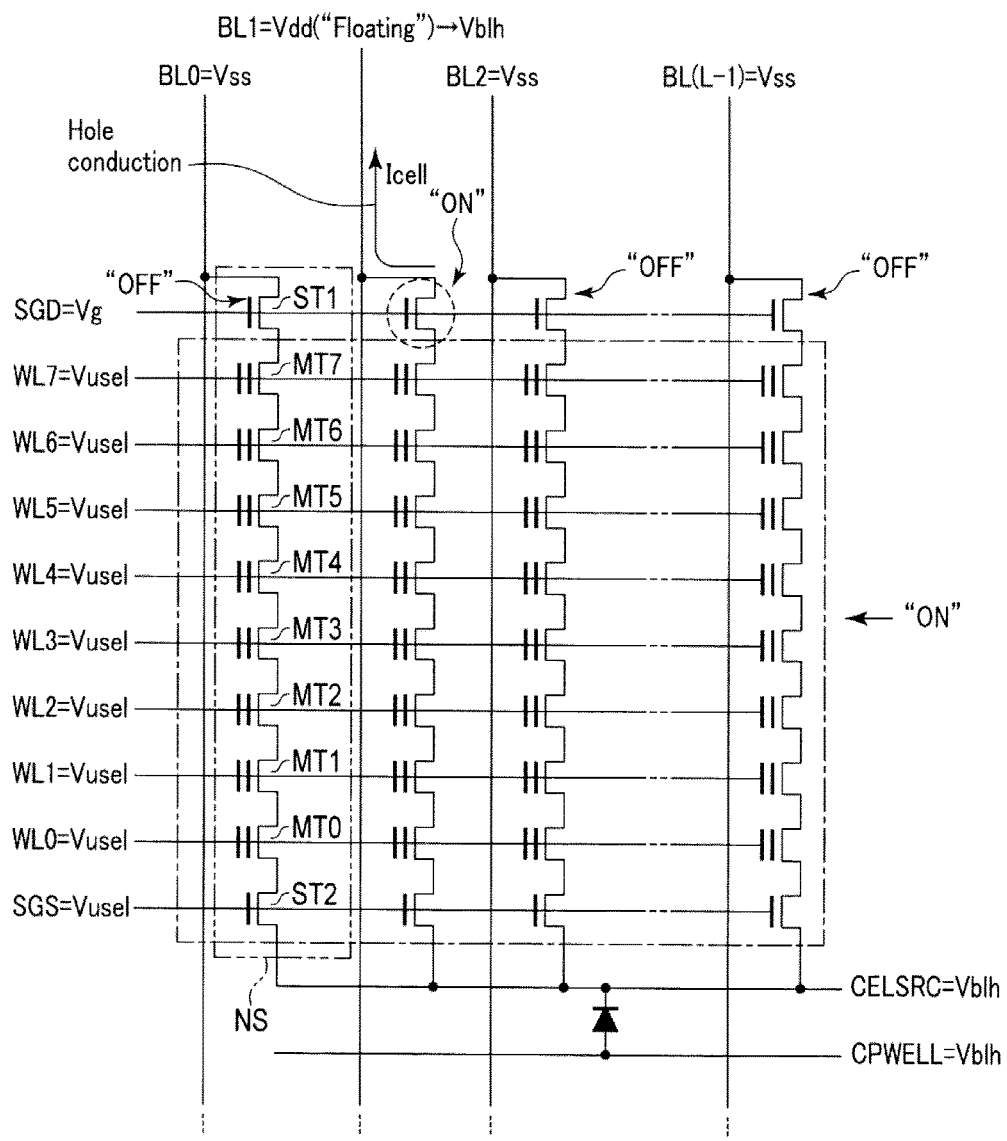
FIG. 17 is a circuit diagram of the memory cell array of the semiconductor memory device according to the third embodiment.

An example of the operation of the memory cell array 10 in a BL charge operation will be described with reference to FIG. 17. FIG. 17 illustrates an example in which the select transistor ST1 connected to the bit line BL1 passes verification, and the select transistors ST1 connected to other bit lines BL fail verification.

In the BL charge operation, Vdd is applied to the bit line BL1 passing verification, and the bit line BL is floated. In contrast, Vss is applied to the write-target bit lines BL failing verification.

When Vg is applied to the select gate line SGD, the select transistor ST1 connected to the bit line BL1 is turned on, and the select transistor ST1 connected to the write-target bit line BL is turned off. When the voltage of the source line CELSRC is set as Vblh, hole current flows through the bit line BL1 from the source line CELSRC to the bit line BL. Accordingly, the bit line BL1 is charged to Vbl from Vdd, and is write-protected. Since the connected select transistor ST1 is turned off, the write-target bit line BL is maintained at Vss.

[3-2] Effects of Third Embodiment

In the semiconductor memory device 1, when all of the bit lines BL are floated, and a high voltage is transferred only to the write-protect bit line BL, the write-target bit line BL cannot be maintained at Vss due to the impact of coupling between the bit lines BL or coupling between the bit lines BL and the source line CELSRC.

In the semiconductor memory device 1 according to the third embodiment, a verify operation is added, and Vss is applied to the write-target bit line BL according to a verification result. Specifically, in the semiconductor memory device 1, Vss is continuously applied from the node SRCGND in the BL charge operation and the SGD write operation, and thus it is possible to fix the voltage of the write-target bit line BL to Vss.

Accordingly, in the semiconductor memory device 1 according to the third embodiment, it is possible to suppress the occurrence of a write failure compared to the first embodiment.

[4] Fourth Embodiment

The semiconductor memory device 1 in a fourth embodiment sets the voltages of the control signals BLS and BLC as Vss after the BL charge operation of the write operation in the third embodiment.

Figure 18:
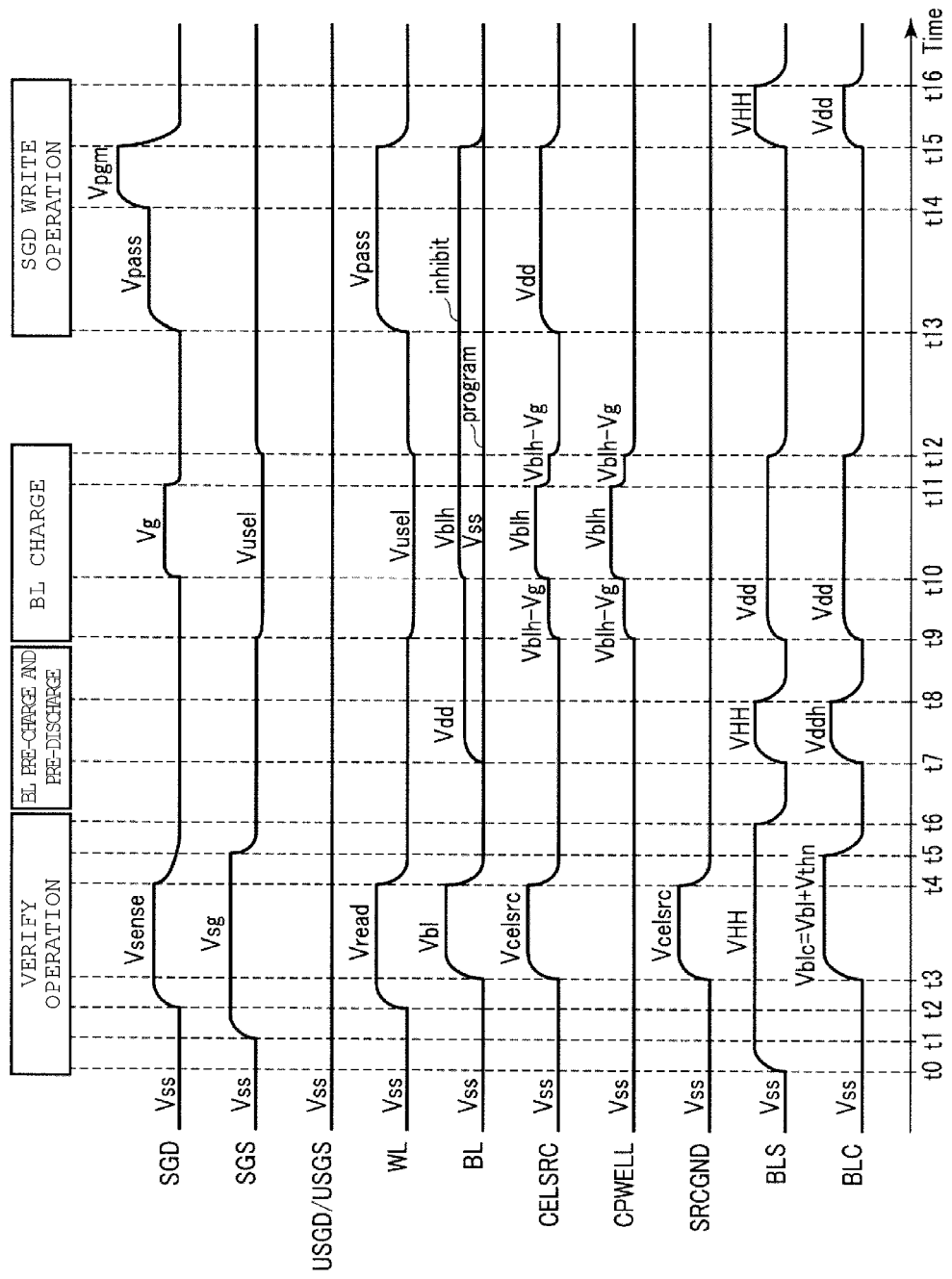
FIG. 18 is a timing chart of a write operation of the semiconductor memory device according to a fourth embodiment.

The operation of the semiconductor memory device 1 in the fourth embodiment will be described with reference to FIG. 18. Operations of the control signals BLS and BLC prior to the BL charge operation are only differences between the operation timing chart illustrated in FIG. 18 and the operation timing chart illustrated in FIG. 16. Hereinafter, only differences from the third embodiment will be described.

The sequencer 14 turns on the transistors 40 and 41 by setting the voltages of the control signals BLS and BLC as Vdd at time t9.

The sequencer 14 turns off the transistors 40 and 41 by setting the voltages of the control signals BLS and BLC as Vss at time t12. Since the select transistor ST1 is turned off at this time, all of the bit lines BL are floated. Accordingly, the voltage of the write-protect bit line BL is maintained at Vbl, the voltage of the write-target bit line is maintained at Vss. As a result, the SGD write operation can be performed. Other operations are the same as in the third embodiment.

In the semiconductor memory device 1, noise to the bit line BL is small in the SGD write operation. In the semiconductor memory device 1 according to the fourth embodiment, the voltages of the control signals BLS and BLC after the BL charge operation decrease to Vss, and all of the bit lines BL are floated. Accordingly, in the semiconductor memory device 1 according to the fourth embodiment, it is possible to reduce the power consumption of a write operation compared to the third embodiment.

The timing, in which the voltages of the control signals BLS and BLC decrease to Vss from Vdd in the BL charge operation, is not limited to this timing, and the sequencer 14 may decrease the voltages of the control signals BLS and BLC between time t12 and time t15.

[5] Fifth Embodiment

The semiconductor memory device 1 in a fifth embodiment maintains the voltage of the control signal BLC at Vblc_inh from the BL pre-charge and pre-discharge operation to the SGD write operation of the write operation in the third embodiment.

Figure 19:
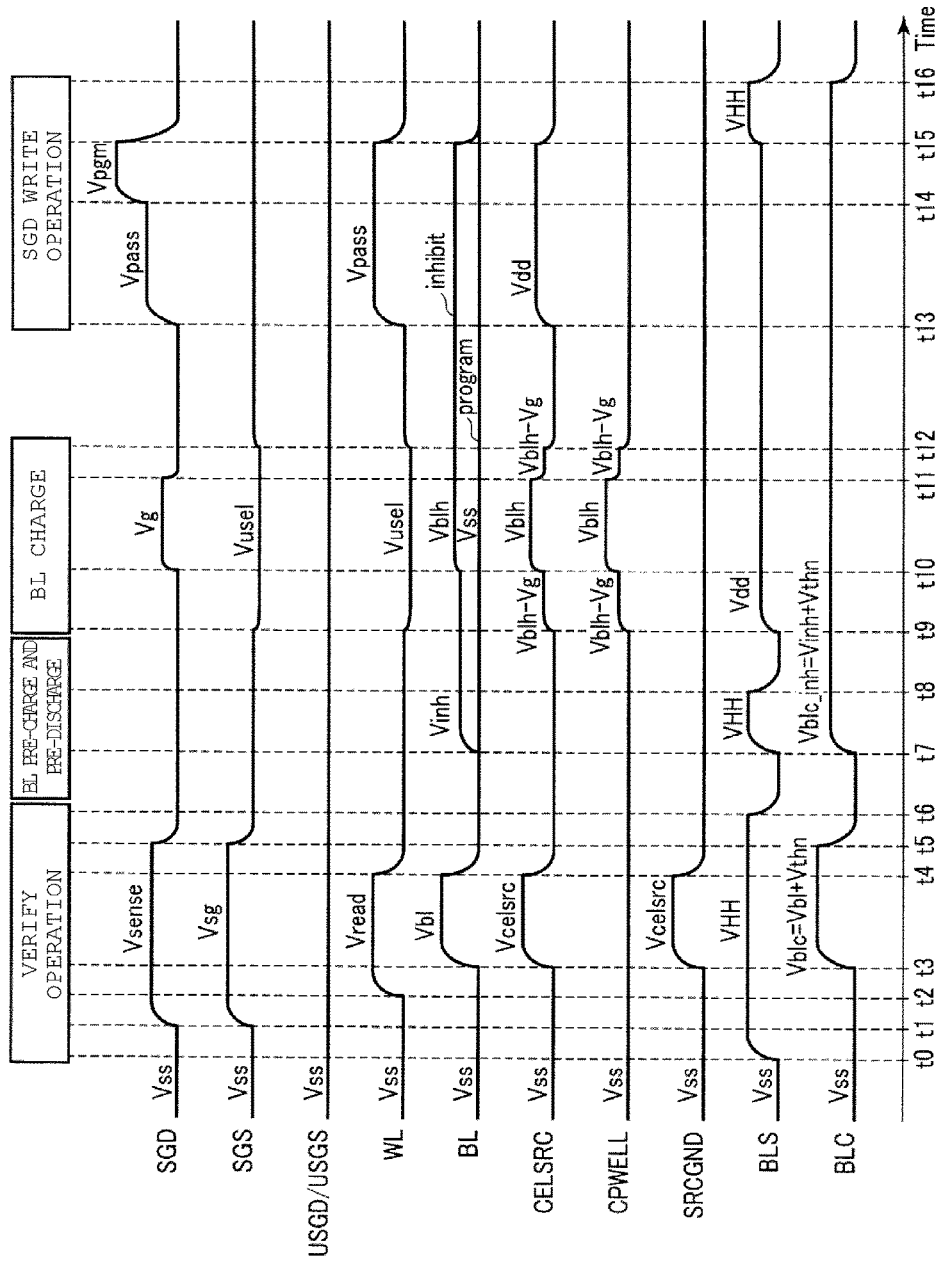
FIG. 19 is a timing chart of a write operation of the semiconductor memory device according to a fifth embodiment.

The operation of the semiconductor memory device 1 in the fifth embodiment will be described with reference to FIG. 19. The operation of the control signal BLC prior to the BL pre-charge and pre-discharge operation is a point of difference between the operation timing chart illustrated in FIG. 19 and the operation timing chart illustrated in FIG. 16. Hereinafter, only differences from the third embodiment will be described.

The sequencer 14 sets the voltage of the control signal BLC as Vblc_inh at time t7. Vblc_inh is equal to Vinh+Vthn, and is a voltage that clamps the voltage of the bit line BL to Vinh. Vinh is set to be lower than Vdd. If the voltage of the write-protect bit line BL is charged to Vinh at this time, the transistor 41 is turned off.

When the sequencer 14 sets the voltages of the source line CELSRC and the well line CPWELL as Vblh at time t10, the voltage of the write-protect bit line BL increases to be Vbl. Accordingly, the voltage of the write-protect bit line BL becomes Vbl, and the voltage of the write-target bit line is maintained at Vss, and thus the SGD write operation can be performed.

At time t16, the sequencer 14 sets the voltage of the control signal BLC as Vblc_inh from the BL pre-charge and pre-discharge operation to the SGD write operation, and sets the voltage of the control signal BLC as Vss. Other operations are the same as in the third embodiment.

As described above, in the semiconductor memory device 1 according to the fifth embodiment, the voltage of the bit line BL in the BL pre-charge and pre-discharge operation is clamped and determined using the control signal BLC, and thus it is possible to reduce power consumption compared to the third embodiment.

[6] Sixth Embodiment

In a sixth embodiment, the write operation of the semiconductor memory device 1 in the first to fifth embodiments is applied to the memory cell transistors MT. Hereinafter, an example, in which the write operation in the first embodiment is applied to the memory cell transistors MT, will be described.

Figure 20:
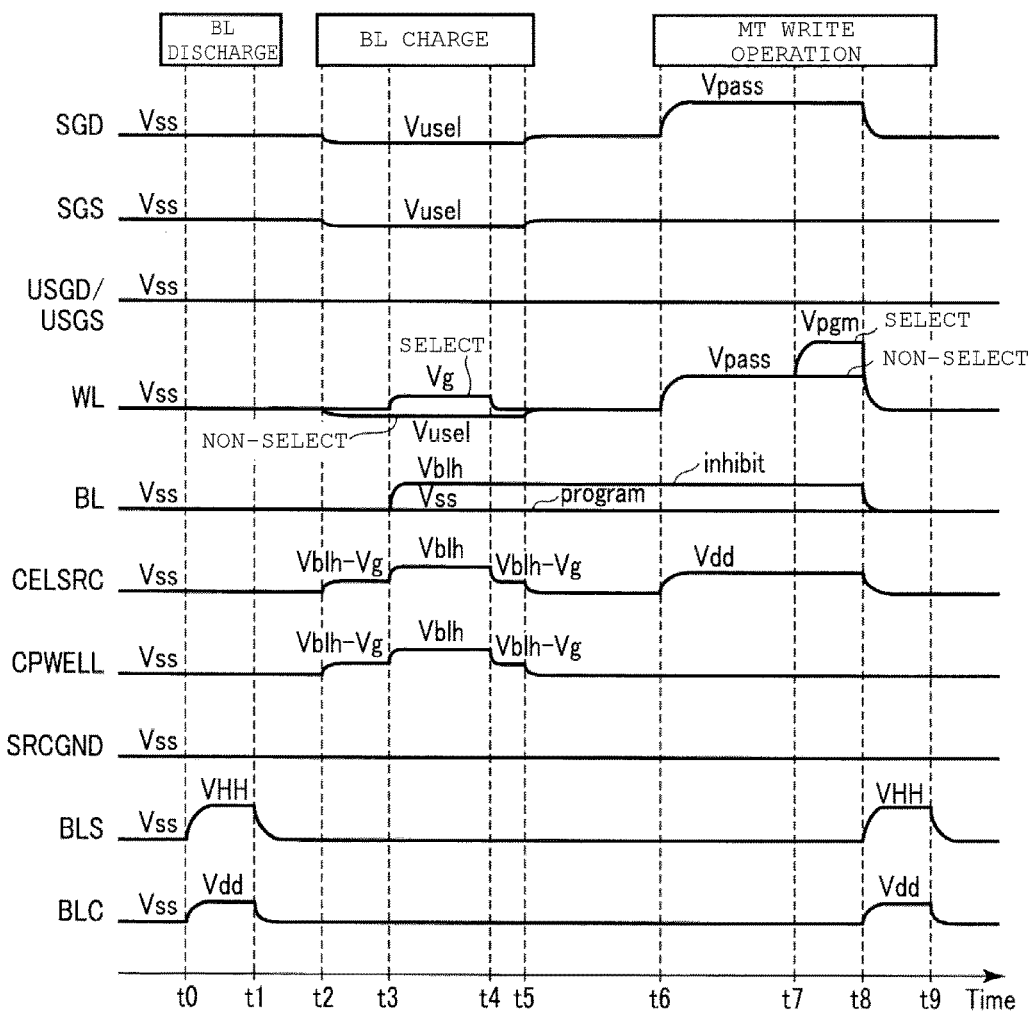
FIG. 20 is a timing chart of a write operation of the semiconductor memory device according to a sixth embodiment.

A write operation of the semiconductor memory device 1 according to the sixth embodiment will be described with reference to FIG. 20. The condition under which a voltage applied to the select gate line SGD and the word line WL is a point of difference between the operation timing chart illustrated in FIG. 20 and the operation timing chart illustrated in FIG. 11. Hereinafter, only differences from the first embodiment will be described.

The sequencer 14 turns on the memory cell transistors MT connected to the select transistor ST1 and a non-selected word line WL by setting the voltages of the select gate line SGD and the non-selected word line WL as Vusel at time t2. The sequencer 14 sets the voltages of the source line CELSRC and the well line CPWELL as Vblh−Vg.

The sequencer 14 sets the voltages of the source line CELSRC and the well line CPWELL as Vblh at time t3. The voltage of a selected word line WL is set as Vg. At this time, among the memory cell transistors MT connected to the selected word line WL, the memory cell transistors MT, of which the threshold voltage Vthn satisfies Vg<Vthn<Vg+Δnp−Vcw, are turned on, and the memory cell transistors MT, of which the threshold voltage Vthn satisfies Vg+Δnp−Vcw≤Vthn, are turned off. Accordingly, Vblh is transferred to the voltage of the write-protect bit line BL from the well line CPWELL, and the voltage of the write-protect bit line BL increases to Vblh. In contrast, since the memory cell transistors MT connected to the selected word line WL and the write-target bit line BL are turned off, the voltage of the write-target bit line BL is maintained at Vss.

The sequencer 14 sets the voltage of the selected word line WL as Vss at time t4. The sequencer 14 sets the voltages of the source line CELSRC and the well line CPWELL as Vblh−Vg.

The sequencer 14 sets the voltages of the select gate lines SGD and SGS, the non-selected word line WL, the source line CELSRC, and the well line CPWELL as Vss at time t5.

The sequencer 14 sets the voltages of the select gate line SGD, the non-selected word line WL, and the selected word line WL as Vpass at time t6.

The sequencer 14 sets the voltage of the selected word line WL as Vpgm at time t7. Accordingly, a high voltage of Vpgm−Vss is applied to the tunnel oxide film 26, and data is written to the memory cell transistors MT connected to the write-target bit line BL and the selected word line WL. In contrast, a voltage of Vpgm−Vblh is applied to the tunnel oxide film 26 in the memory cell transistors MT connected to the write-protect bit line BL and the selected word line WL. If Vblh is sufficiently high at this time, data is not written to the memory cell transistors MT connected to the selected word line WL.

The sequencer 14 sets the voltages of the select gate line SGD, the non-selected word line WL, and the selected word line WL as Vss at time t8. Other operations are the same as in the first embodiment.

That is, the select gate line SGD and the non-selected word line WL operate in the same manner as the word line WL illustrated in FIG. 11. The selected word line WL operates in the same manner as the select gate line SGD illustrated in FIG. 11.

As described above, the write operation in the first embodiment can be applied to the memory cell transistors MT in the semiconductor memory device 1. Similarly, the write operations in the second to fifth embodiments can be applied to the memory cell transistors MT.

[7] Seventh Embodiment

The semiconductor memory device 1 according to a seventh embodiment includes the select gate line SGS provided in each string unit SU, and a select gate line SGSB common to the string units SU. In this case, the write operations of the semiconductor memory device 1 according to the first to fifth embodiments can be also performed on the select transistors ST2. Hereinafter, the seventh embodiment, in which the write operation in the first embodiment is applied to the select transistors ST2, will be described.

Figure 21:
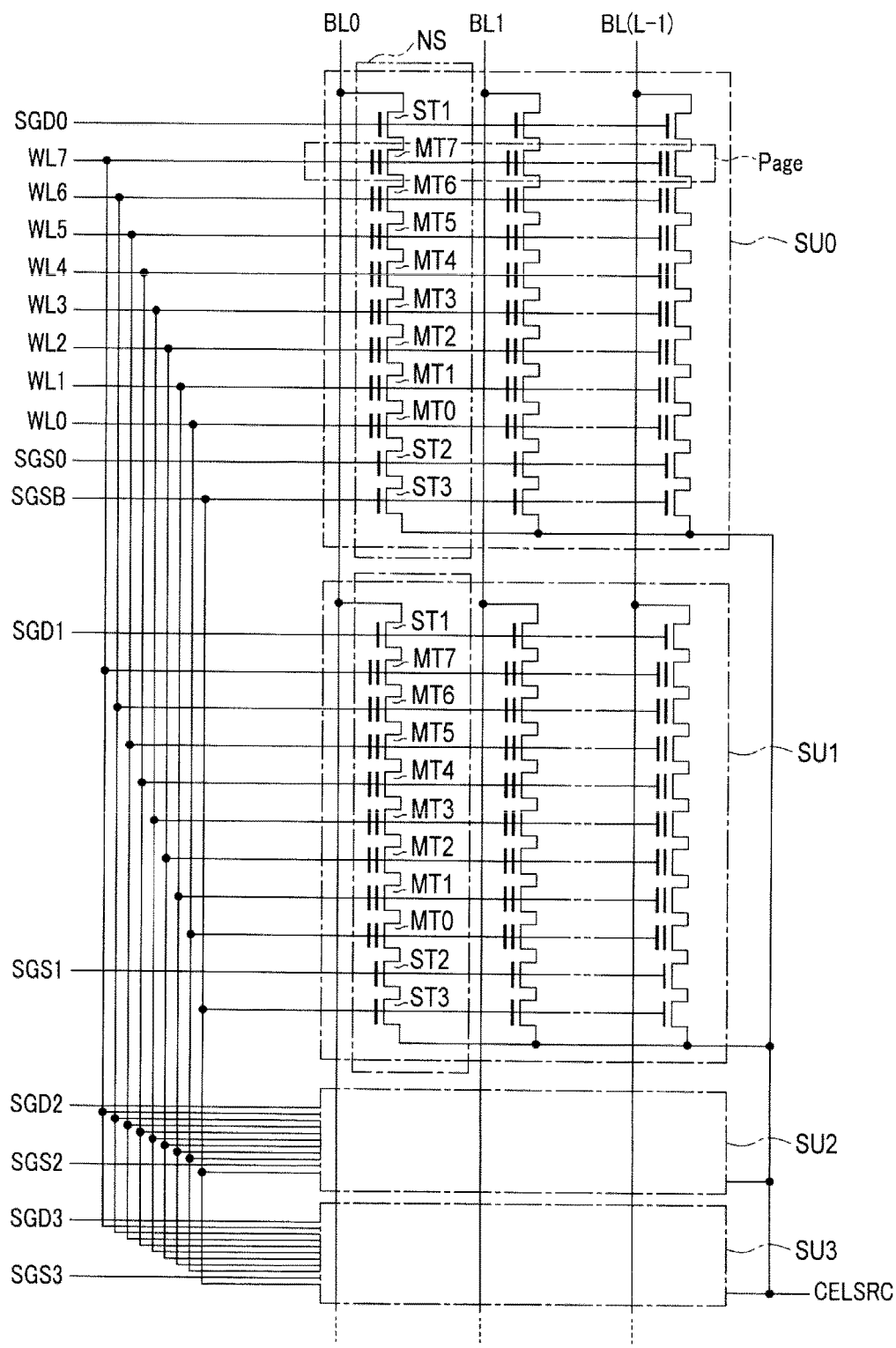
FIG. 21 is a circuit diagram of the memory cell array of the semiconductor memory device according to a seventh embodiment.

Only differences from the first embodiment in the configuration of the block BLK of the memory cell array 10 will be described with reference to FIG. 21.

Each of the NAND strings NS further includes a select transistor ST3. The select transistor ST3 is used to a NAND string NA from which data is written to, read and erased. Each of the select transistor ST3 includes a control gate and a layered gate including a charge storage layer. A first end of the select transistor ST3 is connected to a first end of the select transistor ST2, and a second end of the select transistor ST3 is connected to the source line CELSRC.

Hereinafter, the configuration of wirings connected to the memory cell array 10 will be described. The semiconductor memory device 1 further includes multiple select gate lines SGS and the common select gate line SGSB.

The select gate line SGS is connected to the row decoder 11 (not illustrated), and for example, four select gate lines SGS (select gate lines SGS0 to SGS3) are provided for each of the blocks BLK. The number of select gate lines SGS corresponds to the number of string units SU. The select gate line SGS is connected to the gate of the select transistor ST2 in the corresponding string unit SU.

The common select gate line SGSB is connected to the row decoder 11 (not illustrated), and for example, one select gate line SGSB is provided for each of the blocks. The common select gate line SGSB is connected to the gate of the select transistor ST3 in each of the string units SU.

Figure 22:
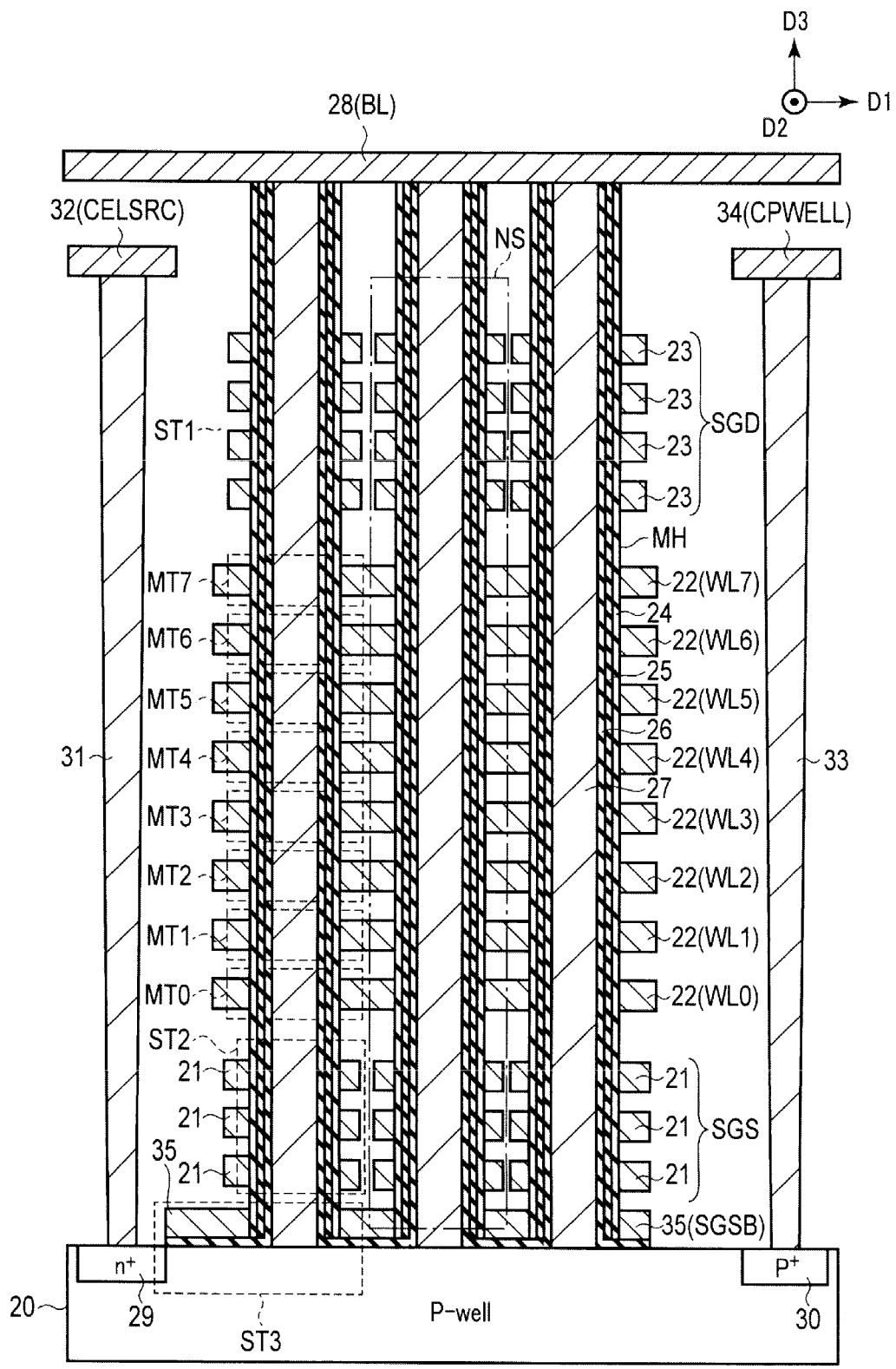
FIG. 22 is a cross sectional view of the memory cell array of the semiconductor memory device according to the seventh embodiment.

Only differences from the first embodiment in the sectional configuration of the memory cell array 10 of the semiconductor memory device 1 according to the seventh embodiment will be described with reference to FIG. 22.

The select gate line SGS is formed of three wiring layers 21, and the common select gate line is formed of one wiring layer 35. The number of wiring layers of the select gate line SGS and the number of wiring layers of the common select gate line SGSB are not limited to those numbers, and can be various other numbers. The wiring layer 35 corresponds to the lowermost wiring layer 21 in FIG. 3. The wiring layers 21 are respectively divided for the NAND strings NS. Other operations are the same as in the first embodiment.

Figure 23:
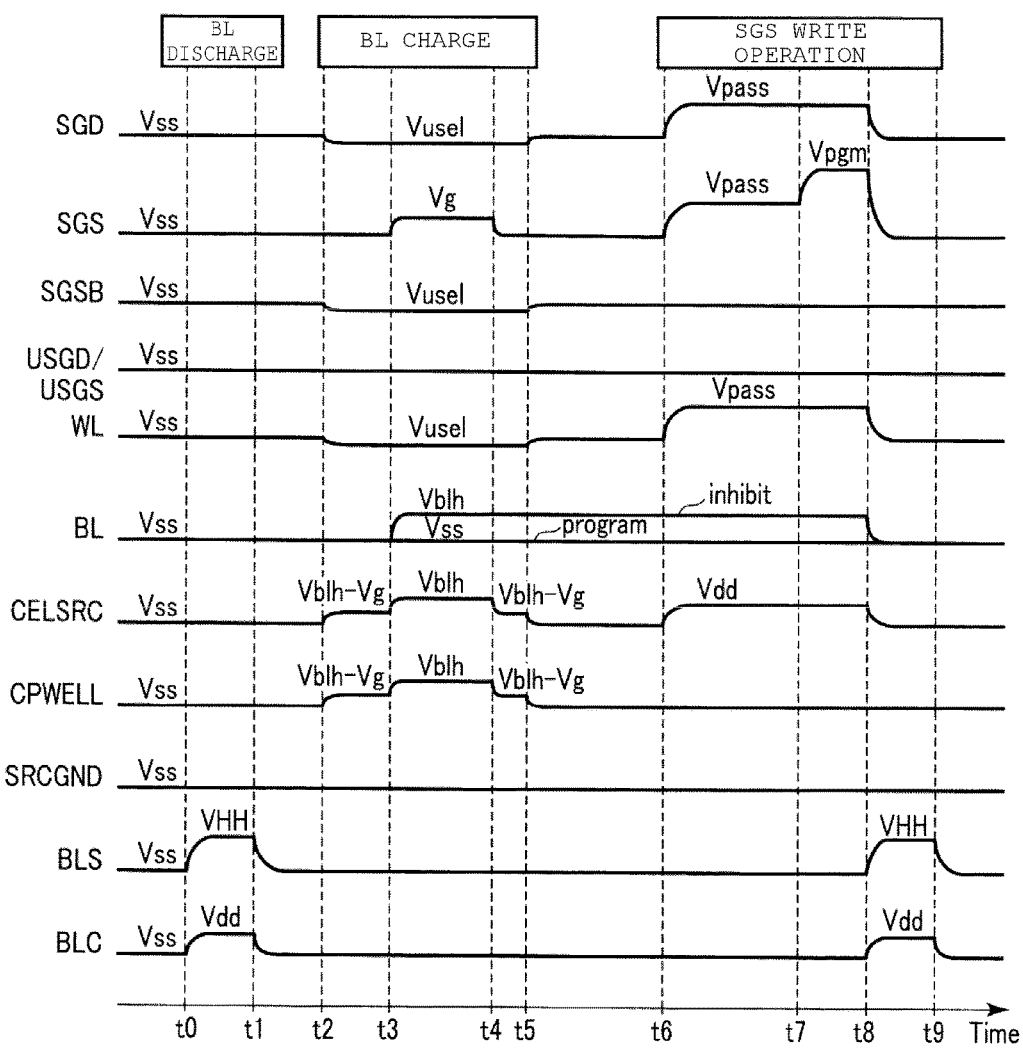
FIG. 23 is a timing chart of a write operation of the semiconductor memory device according to the seventh embodiment.

The write operation of the semiconductor memory device 1 in the seventh embodiment will be described with reference to FIG. 23. A condition of a voltage applied to the select gate lines SGD and SGS is a difference between the operation timing chart illustrated in FIG. 23 and the operation timing chart illustrated in FIG. 11. Hereinafter, only differences from the first embodiment will be described.

The sequencer 14 turns on the select transistor ST1 by setting the voltage of the select gate line SGD as Vusel at time t2. The sequencer 14 sets the voltages of the source line CELSRC and the well line CPWELL as Vblh−Vg.

The sequencer 14 sets the voltages of the source line CELSRC and the well line CPWELL as Vblh at time t3. The voltage of the select gate line SGS is set as Vg. At this time, among the select transistors ST2 connected to the select gate lines SGS, the select transistors ST2, of which the threshold voltage Vthn satisfies Vg<Vthn<Vg+Δnp−Vcw, are turned on, and the select transistors ST2, of which the threshold voltage Vthn satisfies Vg+Δnp−Vcw≤Vthn, are turned off. Accordingly, Vblh is transferred to the write-protect bit line BL from the well CPWELL, and the voltage of the write-protect bit line BL increases to Vblh. In contrast, since the select transistors ST2 connected to the write-target bit line BL are turned off, the voltage of the write-target bit line BL is maintained at Vss.

The sequencer 14 sets the voltage of the select gate line SGS as Vss at time t4. The sequencer 14 sets the voltages of the source line CELSRC and the well line CPWELL as Vblh−Vg.

The sequencer 14 sets the voltage of the select gate line SGD, the word line WL, the source line CELSRC, and the well line CPWELL as Vss at time t5.

The sequencer 14 sets the voltage of the select gate lines SGD and SGS as Vpass at time t6.

The sequencer 14 sets the voltage of the select gate line SGS as Vpgm at time t7. Accordingly, a high voltage of Vpgm−Vss is applied to the tunnel oxide film 26, and data is written to the select transistor ST2 connected to the write-target bit line BL. In contrast, a voltage of Vpgm−Vblh is applied to the tunnel oxide film 26 in the select transistor ST2 connected to the write-protect bit line BL. If Vbl is sufficiently high at this time, data is not written to the select transistor ST2 connected to the write-protect bit line BL.

The sequencer 14 sets the voltage of the select gate lines SGS and SGD as Vss at time t8. Other operations are the same as in the first embodiment.

That is, the select gate line SGD operates in the same manner as the word line WL illustrated in FIG. 11. The common select gate line SGSB operates in the same manner as the select gate line SGS illustrated in FIG. 11. The select gate line SGS operates in the same manner as the select gate line SGD illustrated in FIG. 11.

As described above, the write operation of the semiconductor memory device 1 according to the first embodiment can be applied to the select transistor ST2 of the semiconductor memory device 1 according to the seventh embodiment. Accordingly, it is possible to narrow the threshold voltage distribution of the select transistor ST2, and to improve the reliability of the semiconductor memory device 1. Similarly, the write operations in the second to fifth embodiments can be applied to the select transistor ST2, and to obtain the same effects.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the embodiments, (1) in the read operation, a voltage applied to a selected word line in an A level of read operation is between 0 V and 0.55 V. The applied voltage is not limited to the range, and may be between 0.1 V and 0.24 V, 0.21 V and 0.31 V, 0.31 V and 0.4 V, 0.4 V and 0.5 V, or 0.5 V and 0.55 V.

A voltage applied to a selected word line in a B level of read operation is, for example, between 1.5 V and 2.3 V. The applied voltage is not limited to the range, and may be between 1.65 V and 1.8 V, 1.8 V and 1.95 V, 1.95 V and 2.1 V, or 2.1 V and 2.3 V.

A voltage applied to a selected word line in a C level of read operation is, for example, between 3.0 V and 4.0 V. The applied voltage is not limited to the range, and may be between 3.0 V and 3.2 V, 3.2 V and 3.4 V, 3.4 V and 3.5 V, 3.5 V and 3.6 V, or 3.6 V and 4.0 V.

A read operation time (tR) may be, for example, between 25 μs and 38 μs, 38 μs and 70 μs, or 70 μs and 80 μs.

(2) A write operation includes the aforementioned program operation and the aforementioned verify operation. In the write operation, an initial voltage applied to a selected word line in the program operation is, for example, between 13.7 V and 14.3 V. The applied voltage is not limited to the range, and may be, for example, between 13.7 V and 14.0 V, or 14.0 V and 14.6 V.

An initial voltage applied to a selected word line when data is written to an odd-numbered word line may be different from an initial voltage applied to a selected word line when data is written to an even-numbered word line.

When the program operation is performed using an incremental step pulse program (ISPP) method, a step-up voltage is, for example, approximately 0.5 V.

A voltage applied to a non-selected word line may be, for example, between 6.0 V and 7.3 V. The applied voltage is not limited to the range, and may be between 7.3 V and 8.4 V, or may be less than or equal to 6.0 V.

An applied path voltage may be changed depending on whether the non-selected word line is an odd-numbered word line or an even-numbered word line.

A write operation time (tProg) may be, for example, between 1,700 μs and 1,800 μs, 1,800 μs and 1,900 μs, or 1,900 μs and 2,000 μs.

(3) In an erase operation, an initial voltage applied to the well, which is formed on the semiconductor substrate, and on which the memory cells are arranged, is, for example, between 12 V and 13.6 V. The applied voltage is not limited to the range, and may be, for example, between 13.6 V and 14.8 V, 14.8 V and 19.0 V, 19.0 V and 19.8 V, or 19.8 V and 21 V.

An erase operation time (tErase) may be, for example, between 3,000 μs and 4,000 μs, 4,000 μs and 5,000 μs, or 4,000 μs and 9,000 μs.

(4) The memory cell is structured to include a charge storage layer that is arranged on the semiconductor substrate (silicon substrate) through a tunnel insulating film with a film thickness of 4 nm to 10 nm. The charge storage layer is capable of having a structure in which an SiN, SiON or the like insulating film with a film thickness of 2 nm to 3 nm is stacked on a polysilicon film with a film thickness of 3 nm to 8 nm. Metal such as Ru may be added to polysilicon. An insulating film is provided on the charge storage layer. This insulating film includes a silicon oxide film with a film thickness of 4 nm to 10 nm that is interposed between a lower layer of High-k film with a film thickness of 3 nm to 10 nm and an upper layer of High-k film with a film thickness of 3 nm to 10 nm. The High-k film is made of HfO or the like. The film thickness of the silicon oxide film can be set to be greater than that of the High-k film. A control electrode with a film thickness of 30 nm to 70 nm is formed on the insulating film with a material with a film thickness of 3 nm to 10 nm between the insulating film and the control electrode. The material referred to here is a metal oxide film made of TaO or the like, or a metal nitride film made of TaN or the like. The control electrode can be made of W or the like. Air gaps can be formed between the memory cells.

What is claimed is:

1. A semiconductor memory device comprising:
   a memory string that is formed on a well, the memory string including a first select transistor, a memory cell transistor, and a second select transistor connected in series;
   a bit line connected to one end of the first select transistor;
   a source line connected to one end of the second select transistor;
   a well line connected to the well;
   a first select line connected to a gate of the first select transistor;
   a word line connected to a gate of the memory cell transistor;
   a second select line connected to a gate of the second select transistor; and
   a control circuit configured to perform a write operation on the first select transistor, wherein
   in the write operation, a pre-charge operation of the bit line is performed before a program voltage is applied to the first select line, and
   in the pre-charge operation,
   a first voltage is applied to the word line and the second select line,
   a second voltage higher than the first voltage is applied to the source line and the well line, and
   a third voltage higher than the first voltage is applied to the first select line.

2. The device according to claim 1, wherein
   the pre-charge operation includes consecutive first, second, and third time periods, and
   the first voltage is applied to the word line and the second select line during each of the first, second, and third time periods, and the second voltage and the third voltage are applied respectively to the source line and the well line and to the first select line, during just the second period.

3. The device according to claim 2, wherein an intermediate voltage is applied to the source line and the well line during the first period and the third period, the intermediate voltage being equal to the second voltage minus the third voltage.

4. The device according to claim 1, wherein after the pre-charge operation,
- a fourth voltage, which is lower than each of the second and third voltages, is applied to each of the word line, the second select line, the source line, the well line, and the first select line, and then
- a fifth voltage higher than the fourth voltage is applied to the first select line and the word line, and a sixth voltage higher than the fourth voltage is applied to the source line.

5. The device according to claim 4, wherein the program voltage, which is higher than the fifth voltage, is applied to the first select line while the fifth voltage is applied to the word line and the sixth voltage is applied to the source line.

6. The device according to claim 4, wherein the first voltage and the fourth voltage are the same.

7. The device according to claim 4, wherein the first voltage is less than the fourth voltage.

8. The device according to claim 4, wherein the fifth voltage is higher than the second voltage.

9. The device according to claim 1, wherein the write operation is performed for a predetermined number of loops during which the program voltage is increased for each subsequent loop, and the write operation is terminated in accordance with the third voltage.

10. The device according to claim 9, wherein a new value for the third voltage is set if the write operation is not terminated after the predetermined number of loops has been performed.

11. A semiconductor memory device comprising:
- a memory string that is formed on a well, the memory string including a first select transistor, a memory cell transistor, and a second select transistor connected in series;
- a bit line connected to one end of the first select transistor;
- a source line connected to one end of the second select transistor;
- a well line connected to the well;
- a first select line connected to a gate of the first select transistor;
- a word line connected to a gate of the memory cell transistor;
- a second select line connected to a gate of the second select transistor; and
- a control circuit configured to perform a write operation on the first select transistor, wherein
- in a first phase of the write operation, a first voltage is applied to the word line and the second select line, a second voltage higher than the first voltage is applied to the source line and the well line, and a third voltage higher than the first voltage is applied to the first select line, and
- in a second phase of the write operation that follows the first phase, a fourth voltage is applied to the word line and a fifth voltage higher than the fourth voltage is applied to the first select line.

12. The device according to claim 11, wherein
the first phase of the write operation includes consecutive first, second, and third time periods, and
the first voltage is applied to the word line and the second select line during each of the first, second, and third time periods, and the second voltage and the third voltage are applied respectively to the source line and the well line and to the first select line, during just the second period.

13. The device according to claim 12, wherein an intermediate voltage is applied to the source line and the well line during the first period and the third period, the intermediate voltage being equal to the second voltage minus the third voltage.

14. The device according to claim 11, wherein during the second phase of the write operation,
the fourth voltage is applied to the word line and the first select line at the same time and then the fifth voltage is applied to the first select line while the fourth voltage is continued to be applied to the word line.

15. The device according to claim 14, wherein during the second phase of the write operation, while the fourth voltage is applied to the word line,
- a sixth voltage, which is lower than each of the second and third voltages, is applied to each of the word line, the second select line, the source line, the well line, and the first select line, and
- a seventh voltage higher than the sixth voltage is applied to the source line.

16. The device according to claim 15, wherein the first voltage and the sixth voltage are the same.

17. The device according to claim 15, wherein the first voltage is less than the sixth voltage.

18. The device according to claim 15, wherein the fourth voltage is higher than the second voltage.

19. The device according to claim 11, wherein the write operation is performed for a predetermined number of loops during which a fifth voltage is increased for each subsequent loop, and the write operation is terminated in accordance with the third voltage.

20. The device according to claim 19, wherein a new value for the third voltage is set if the write operation is not terminated after the predetermined number of loops has been performed.

* * * * *